(12) United States Patent
Ootsuka et al.

(10) Patent No.: US 6,806,128 B2
(45) Date of Patent: Oct. 19, 2004

(54) SEMICONDUCTOR INTEGRATED CIRCUIT DEVICE AND A METHOD OF MANUFACTURING THE SAME

(75) Inventors: Fumio Ootsuka, Tokorozawa (JP); Katsuhiko Ichinose, Ome (JP); Shoji Wakahara, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/898,050

(22) Filed: Jul. 5, 2001

(65) Prior Publication Data

US 2002/0005553 A1 Jan. 17, 2002

(30) Foreign Application Priority Data

Jul. 6, 2000 (JP) ........................................ 2000-204929

(51) Int. Cl.[7] ......................................... H01L 21/8238
(52) U.S. Cl. ........................ 438/199; 438/197; 438/202; 438/205; 438/309
(58) Field of Search ................................ 257/335, 336, 257/344, 368, 369, 370, 371, 382; 438/197, 199, 202, 205, 223, 224, 227, 228, 300, 301, 309

(56) References Cited

U.S. PATENT DOCUMENTS

| 5,079,180 | A |  | 1/1992 | Rodder et al. |  |
|---|---|---|---|---|---|
| 5,449,937 | A | * | 9/1995 | Arimura et al. | 257/345 |
| 5,668,024 | A | * | 9/1997 | Tsai et al. | 438/199 |
| 5,830,788 | A | * | 11/1998 | Hiroki et al. | 438/199 |
| 5,880,500 | A | * | 3/1999 | Iwata et al. | 257/336 |
| 6,162,692 | A | * | 12/2000 | Gardner et al. | 438/301 |
| 6,281,558 | B1 | * | 8/2001 | Sayama et al. | 257/391 |
| 6,326,281 | B1 | * | 12/2001 | Violette et al. | 438/413 |
| 6,432,763 | B1 | * | 8/2002 | Yu | 438/217 |
| 6,512,273 | B1 | * | 1/2003 | Krivokapic et al. | 257/369 |
| 2001/0025994 | A1 | * | 10/2001 | Yoshino et al. | 438/199 |

FOREIGN PATENT DOCUMENTS

| JP | 06-005872 | * | 1/1994 | ................ 29/788 |
| JP | 9-199720 |  | 7/1997 | |

* cited by examiner

Primary Examiner—Eddie Lee
Assistant Examiner—Quang Vu
(74) Attorney, Agent, or Firm—Antonelli, Terry, Stout & Kraus, LLP

(57) ABSTRACT

With a gate electrode and side wall spacers being used as masks, ions of an n-type impurity are implanted from the normal line direction of a substrate, whereby source/drain diffused regions are formed. Then, ions of an n-type impurity are introduced by oblique implantation having a predetermined angle relative to the normal line direction of the substrate to form an n-type semiconductor region having an impurity concentration higher than source/drain extended regions. By this method, the junction depth of the semiconductor region becomes smaller than that of the source/drain diffused regions and greater than that of the source/drain extended regions.

35 Claims, 19 Drawing Sheets

SEMICONDUCTOR INTEGRATED CIRCUIT DEVICE AND A METHOD OF MANUFACTURING THE SAME

The present invention relates to a semiconductor integrated circuit device and a manufacturing technique thereof. In particular, the invention pertains to a technique effective when adapted to a semiconductor integrated circuit device having an MISFET (Metal Insulator Semiconductor Field Effect Transistor) which has a gate length of next generation not greater than 0.15 μm and is required to have high speed operation.

BACKGROUND OF THE INVENTION

In a so-called SALICIDE (self-aligned silicide) technique by which a refractory metal silicide layer, for example, a layer of cobalt silicide ($CoSi_2$) or titanium silicide ($TiSi_2$) is formed over the source/drain and gate electrode of MISFET, an increase in a contact resistance is prevented by setting an impurity concentration on the surface of a semiconductor brought into contact with the silicide layer at $1\times10^{20}$ $cm^{-3}$ or greater.

In FIG. 29, shown is an influence of an impurity concentration in a semiconductor on the contact resistance between a metal and a semiconductor. FIG. 29(a) illustrates the contact resistance with a semiconductor of an n conductivity type, while FIG. 29(b) illustrates the contact resistance with a semiconductor of a p conductivity type. The contact resistance between the metal and the semiconductor was calculated from the following equation (1):

$$\text{Exp } (A \, \Phi/\text{SQRT } (N)) \qquad \text{Equation (1)}$$

wherein, $\Phi$ stands for a difference in the work function between the metal and semiconductor, N stands for an impurity concentration in the semiconductor, and A means a proportionality factor. The drawings suggest that the contact resistance shows a drastic increase when the impurity concentration in the semiconductor becomes less than $1\times10^{20}$ $cm^{-3}$.

The silicide-layer forming technique over source/drain regions which technique has been investigated by the present inventors will next be described simply.

First, an impurity of a relatively low concentration is injected to a substrate by ion implantation from the outside of a gate electrode, whereby extended semiconductor regions (which will hereinafter be called "source/drain extended regions") constituting a part of source/drain are formed in the substrate at both sides of a gate electrode. After disposal of side wall spacers on the side walls of the gate electrode, an impurity of a relatively high concentration is injected to the substrate by ion implantation from the outside of these side wall spacers, whereby diffused semiconductor regions (which will hereinafter be called "source/drain diffused regions") constituting another portion of source/drain and having a surface concentration of $1\times10^{20}$ $cm^{-3}$ or greater are formed in the substrate at both sides of the gate electrode. On the surface of these source/drain diffused regions, a silicide layer is formed in self alignment.

In a semiconductor device of the generation wherein the gate length is 0.2 μm or greater, the junction depth of the source/drain diffused regions is about 0.2 μm and width in the lateral direction is about 0.1 μm, while the thickness of the silicide layer, more specifically, that of a $CoSi_2$ film is about 0.04 μm and that of a $TiSi_2$ film is about 0.07 μm, which is set thinner than the lateral width of the source/drain diffused regions.

SUMMARY OF THE INVENTION

In a semiconductor device of the generation having a gate length not greater than 0.15 μm or less, however, the junction depth of the source/drain regions and the width in the lateral direction decrease to 0.1 μm or less and 0.05 μm or less, respectively. It has been revealed by the present inventors that in such a device, the width in the lateral direction becomes much the same with the thickness of the silicide layer, causing an unknown problem that the silicide layer is inevitably brought into contact with the source/drain extended regions.

Since the impurity concentration in the source/drain extended regions is set at a relatively low level in order to reduce an occurrence ratio of hot carriers, the contact resistance increases by the contact of the silicide layer with the source/drain extended regions, leading to lowering of the on-state current of MISFET. In particular, when side wall spacers are each formed of a silicon oxide film, they are etched during a cleaning step of a substrate with hydrofluoric acid (HF) and the silicide layer tends to be brought into contact with the source/drain extended regions, leading to marked lowering of the on-state current of MISFET.

In an MISFET having a so-called build-up source/drain structure which is obtained by forming side wall spacers on the side walls of a gate electrode, and then allowing a silicon (Si) layer or a germanium(GE)-containing Si layer to selectively grow on a substrate, a facet appears at the end portion of the side wall spacers (which will hereinafter be called "spacer end portion"), causing a decrease in the thickness of the Si layer at the spacer end portion. Moreover, in this MISFET having a build-up source/drain structure, the silicide layer is formed thicker than the silicide layer of an MISFET having an ordinary source/drain structure to reduce a sheet resistance so that an encroachment amount in the lateral direction at the spacer end portion becomes large, tending to cause a problem that the silicide layer is brought into contact with the source/drain extended regions.

An object of the present invention is to provide a technique capable of realizing high-speed operation of MISFET of the generation having a gate length of 0.15 μm or less.

The above-described object and another object, and novel features of the present invention will be apparent from both the description therein and accompanied drawings.

Of the inventions to be disclosed by the present application, typical ones will next be summarized briefly.

(1) A semiconductor integrated circuit device according to the present invention comprises an MISFET equipped with source/drain extended regions formed by introducing n-type impurities into a substrate with a gate electrode as a mask, source/drain diffused regions formed by introducing n-type impurities into the substrate with the gate electrode and side wall spacers, which have been formed on the side surfaces (walls) of the gate electrode, as masks and a cobalt silicide layer on the surface of the source/drain diffused regions, wherein the junction depth of the source/drain extended regions is smaller than that of the source/drain diffused regions, an n-type semiconductor region formed by introducing n-type impurities into the substrate with the gate electrode and side wall spacers as masks, lies between the source/drain extended regions and the source/drain diffused regions, a portion or the whole portion of the end portion of the cobalt silicide layer is in contact with the n-type semiconductor region, and the impurity concentration in the n-type semiconductor region is higher than that of the source/drain extended regions.

(2) A method of manufacturing a semiconductor integrated circuit device according to the present invention comprises the steps of: forming over a substrate a gate electrode made of a silicon film, implanting ions of a first n-type impurity into the substrate with the gate electrode as a mask, thereby forming source/drain extended regions, forming side wall spacers on the side walls of the gate electrode, implanting ions of a second n-type impurity into the substrate with the gate electrode and side wall spacers as masks, thereby forming source/drain diffused regions, cleaning the substrate, and after deposition of a cobalt film over the substrate, heat treating the substrate, thereby forming a cobalt silicide layer over the surface of the source/drain diffused regions, which further comprises, prior to the formation of the side wall spacers, of the step of:

implanting, with the gate electrode and side wall spacers as masks, ions of a third n-type impurity into the substrate obliquely at a predetermined inclination relative to the normal line of the substrate, thereby forming an n-type semiconductor region.

By the above-described means, the n-type semiconductor region is formed between the source/drain extended regions and source/drain diffused regions of MISFET, a portion or the whole portion of the end portion of the silicide layer formed in the substrate is surrounded by the n-type semiconductor region, and the impurity concentration of the n-type semiconductor region at a portion to be brought into contact with the silicide layer is made relatively high, for example, about $1 \times 10^{20}$ cm$^{-3}$. This structure makes it possible to lessen the contact resistance of the silicide layer, leading to relaxation of a voltage drop when the current flows from the silicide layer to the source/drain extended regions.

DETAILED DESCRIPTION OF THE PREFERRED EMBODIMENTS

Figure 1:
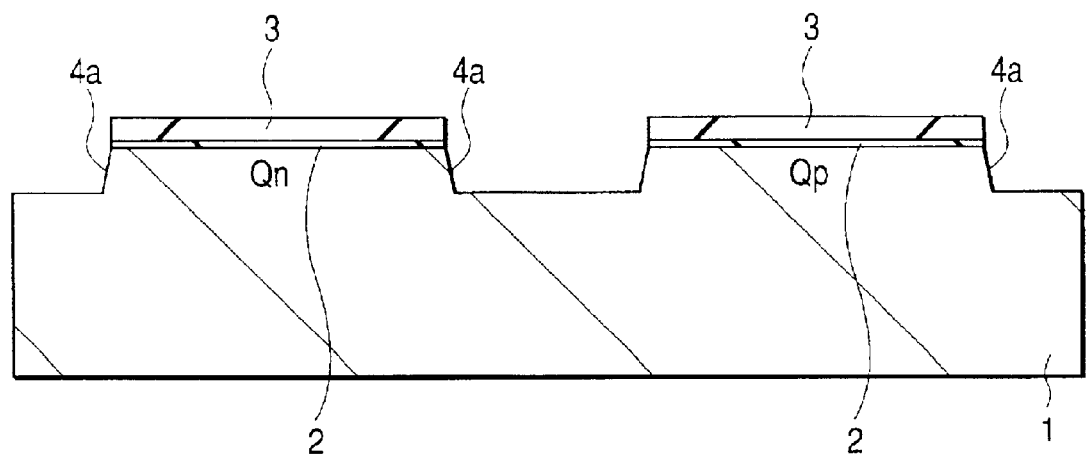
FIG. 1 is a fragmentary cross-sectional view of a manufacturing method of a semiconductor substrate showing a CMOS device according to Embodiment 1 of the present invention.
Figure 2:
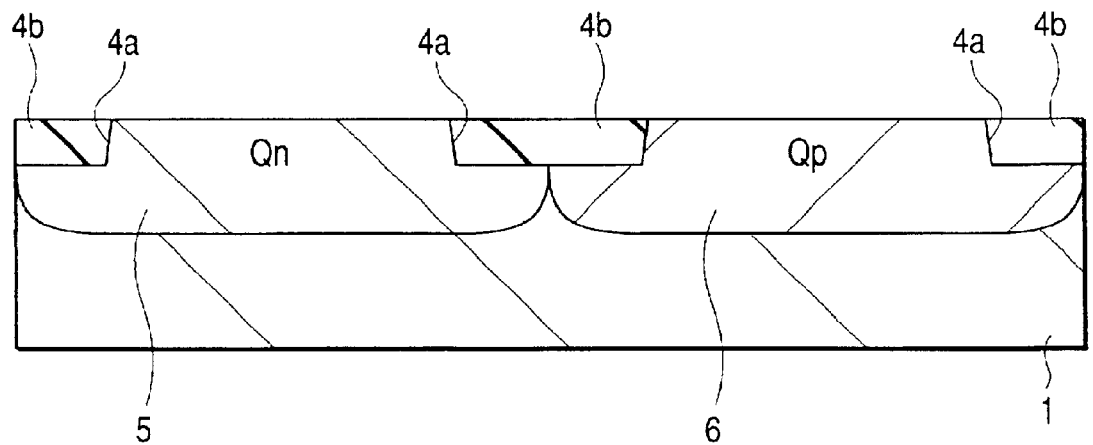
FIG. 2 is a fragmentary cross-sectional view of a manufacturing method of the semiconductor substrate showing the CMOS device according to Embodiment 1 of the present invention.

Embodiments of the present invention will hereinafter be described in details based on accompanied drawings. In all the drawings for describing the embodiments, like members of a function will be identified by like reference numerals and overlapping descriptions will be omitted.
(Embodiment 1)

A CMOS (Complementary Metal Oxide Semiconductor) device, which is one embodiment of the present invention, will be described based on FIGS. 1 to 13. In these drawings, Qn stands for an n channel MISFET, while Qp stands for a p channel type MISFET. CMOS includes Qn and Qp.

As illustrated in FIG. 1, a substrate 1 made of p-type single crystal silicon is prepared. This substrate 1 is thermally oxidized to form, on the surface thereof, a silicon oxide film 2 as thin as about 0.01 $\mu$m. After deposition of a silicon nitride film 3 of about 0.1 $\mu$m thick over the silicon oxide film by CVD (Chemical Vapor Deposition), the silicon nitride film 3, silicon oxide film 2 and substrate 1 are successively dry etched with a resist pattern as a mask, whereby an element isolating groove 4a having a depth of about 0.35 $\mu$m is formed in the substrate 1 of an element isolation region.

After removal of the silicon nitride film 3 by wet etching using hot phosphoric acid, a silicon oxide film 4b deposited over the substrate 1 by CVD is etched back or polished by CMP (Chemical Mechanical Polishing) to leave the silicon oxide film 4b inside of the element isolating groove 4a, whereby an element isolation region is formed. The substrate 1 is then annealed at about 1000° C. to densify the silicon oxide film 4b embedded in the element isolating groove 4a.

Boron (B) ions for the formation of a p-type well 5 in a region for forming an n channel type MISFETQn in the substrate 1 are introduced (injected), while phosphorous (P) ions for the formation of an n-type well 6 in a region for forming a p channel type MISFETQp are injected. The injection of B is conducted at an energy of 200 keV and dose of $2 \times 10^{13}$ cm$^{-2}$ and that of P is conducted at an energy of 500 keV and dose of $3 \times 10^{13}$ cm$^{-2}$.

Figure 3:
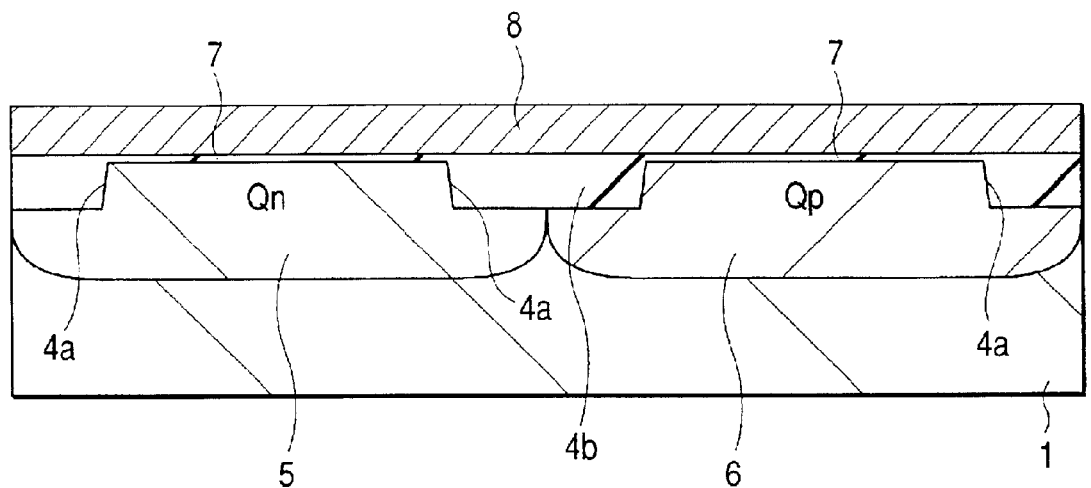
FIG. 3 is a fragmentary cross-sectional view of a manufacturing method of the semiconductor substrate showing the CMOS device according to Embodiment 1 of the present invention.

As illustrated in FIG. 3, after thermal oxidation of the substrate 1, thereby forming a gate insulating film 7 of about 4 nm thick over the surface of each of the p-type well 5 and n-type well 6, an amorphous silicon film 8 is deposited to a thickness of about 200 nm over the substrate by CVD. Into the amorphous silicon film 8 in the region for forming an n channel type MISFETQn, ions of an n-type impurity, for example, P are implanted, while into the amorphous silicon film 8 in the region for forming a p channel type MISFETQp, ions of a p-type impurity, for example, B are implanted. Implantation of P ions is conducted at an energy of 10 keV and dose of $8 \times 10^{15}$ cm$^{-2}$, while that of B ions is conducted at an energy of 5 keV and dose of $4 \times 10^{15}$ cm$^{-2}$.

Figure 4:
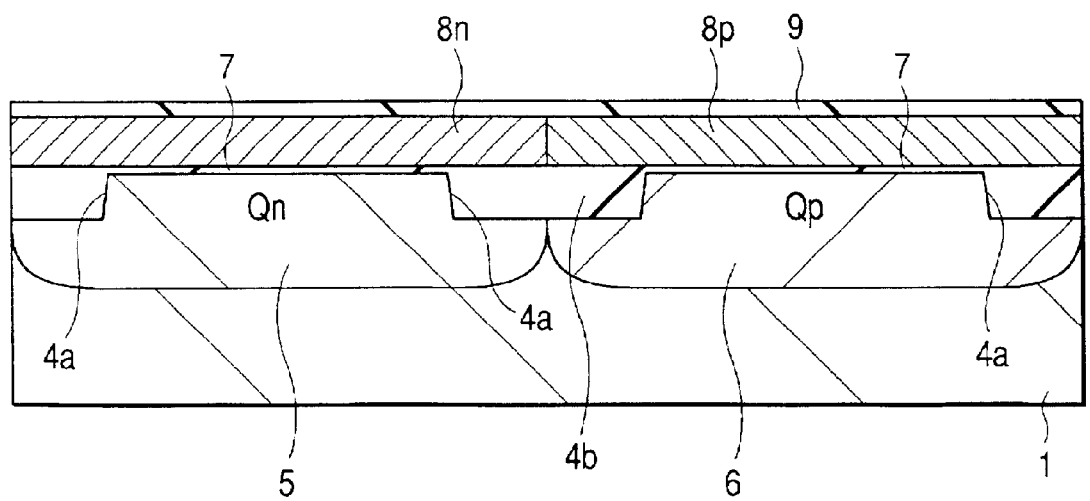
FIG. 4 is a fragmentary cross-sectional view of a manufacturing method of the semiconductor substrate showing the CMOS device according to Embodiment 1 of the present invention.

As illustrated in FIG. 4, a silicon oxide film 9 of about 50 nm thick is formed over the amorphous silicon film 8. The substrate 1 is then thermally treated at 950° C. for about 60 seconds to activate the n-type impurity and p-type impurity introduced into the amorphous silicon film 8 and in addition, to change the amorphous silicon film 8 in the region for forming an n channel type MISFETQn to n-type polycrystalline silicon film 8n and that in the region for forming a p channel type MISFETQp to p-type polycrystalline silicon film 8p.

Figure 5:
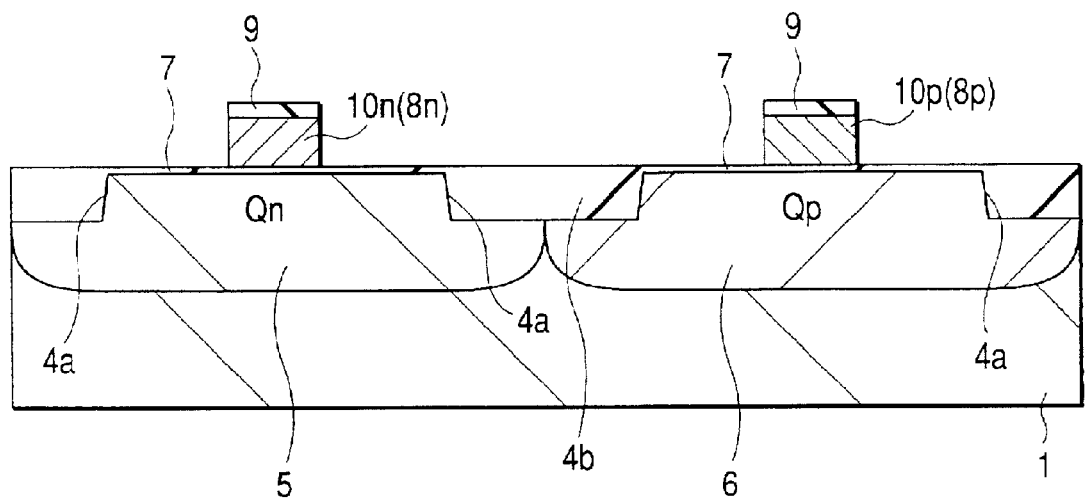
FIG. 5 is a fragmentary cross-sectional view illustrating a manufacturing method of the semiconductor substrate showing the CMOS device according to Embodiment 1 of the present invention.

As illustrated in FIG. 5, the silicon oxide film 9 and n-type polycrystalline silicon film 8n are successively etched with a resist pattern as a mask to form a gate electrode 10n, which is made of the n-type polycrystalline silicon film 8n and has a gate length of 0.15 $\mu$m, in the region for forming an n channel type MISFETQn. At the same time, with a resist pattern as a mask, the silicon oxide film 9 and p-type polycrystalline silicon film 8p are successively etched to form a gate electrode 10p, which is made of the p-type polycrystalline silicon film 8p and has a gate length of 0.15 $\mu$m, in the region for forming a p channel type MISFETQp. Then, the substrate 1 is subjected to dry oxidation treatment, for example, at 800° C.

Figure 6:
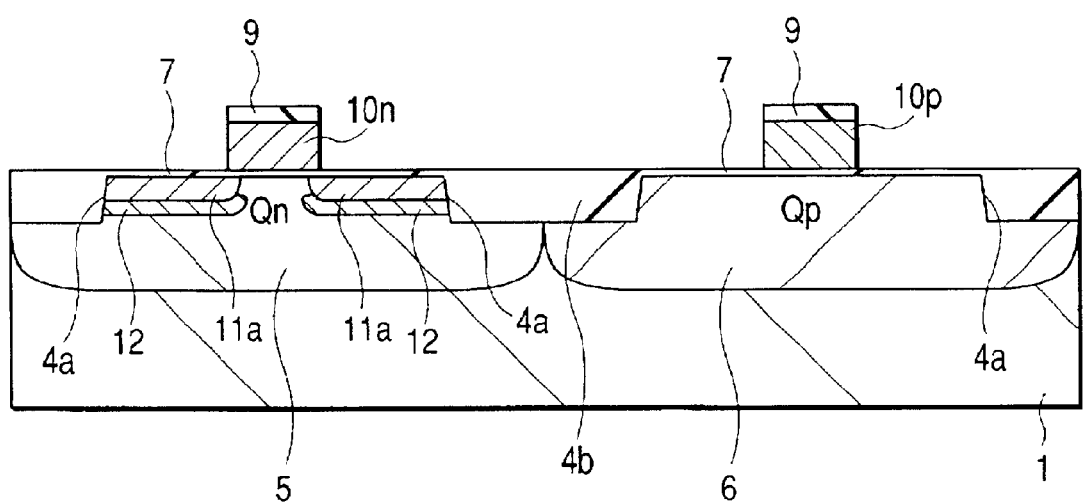
FIG. 6 is a fragmentary cross-sectional view illustrating a manufacturing method of the semiconductor substrate showing the CMOS device according to Embodiment 1 of the present invention.

As illustrated in FIG. 6, after covering the n-type well 6 with a resist film, ions of an n-type impurity, for example, arsenic (As) are implanted to the p-type well 5 in self alignment with the gate electrode 10n of the n channel type MISFETQn, whereby source/drain extended regions 11a of the n channel type MISFETQn are formed. Then, ions of a p-type impurity, for example, B or indium (In) are implanted to form a pocket layer 12, which functions as a punch through stopper, in contact with the lower portion of the source/drain extended regions 11a. The pocket layer 12 is also formed in self alignment with the gate electrode 10n. The above-described As ions are implanted, for example, at an energy of 5 keV and dose of $1 \times 10^{15}$ cm$^{-2}$, while the B ions are implanted, for example, at an energy of 20 keV and dose of $4 \times 10^{13}$ cm$^{-2}$.

Figure 7:
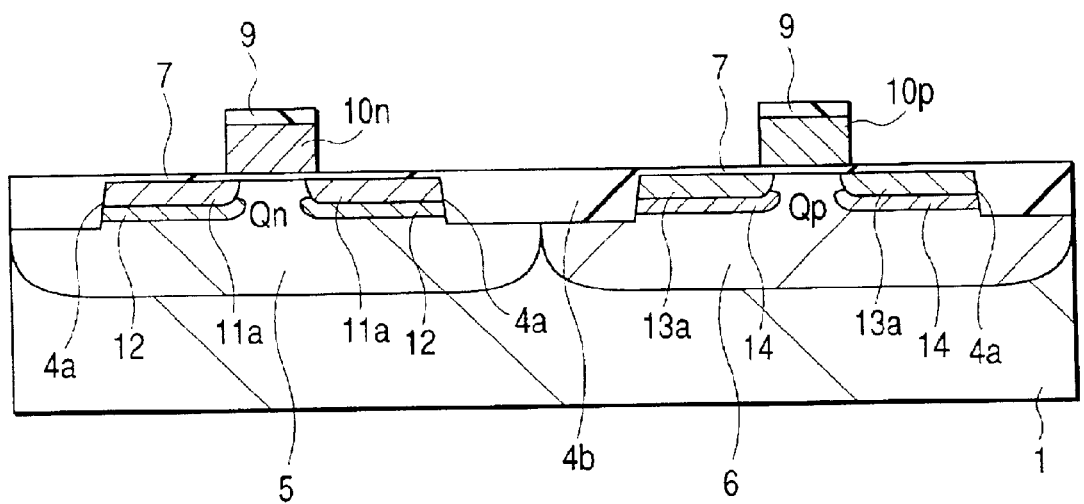
FIG. 7 is a fragmentary cross-sectional view illustrating a manufacturing method of the semiconductor substrate showing the CMOS device according to Embodiment 1 of the present invention.

As illustrated in FIG. 7, after covering the p-type well 5 with a resist film, ions of a p-type impurity, for example, boron fluoride (BF$_2$) are implanted to the n-type well 6 in self alignment with the gate electrode 10p of the p channel type MISFETQp, whereby source/drain extended regions 13a of the p channel type MISFETQp are formed. Then, ions of an n-type impurity, for example, P or As are implanted to form a pocket layer 14, which functions as a punch through stopper, in contact with the lower portion of the source/drain extended regions 13a. The pocket layer 12 is also formed in self alignment with the gate electrode 10n. The BF$_2$ ions are implanted, for example, at an energy of 3 keV and dose of $1 \times 10^{15}$ cm$^{-2}$, while the P ions are implanted, for example, at an energy of 60 keV and dose of $4 \times 10^{13}$ cm$^{-2}$.

Figure 8:
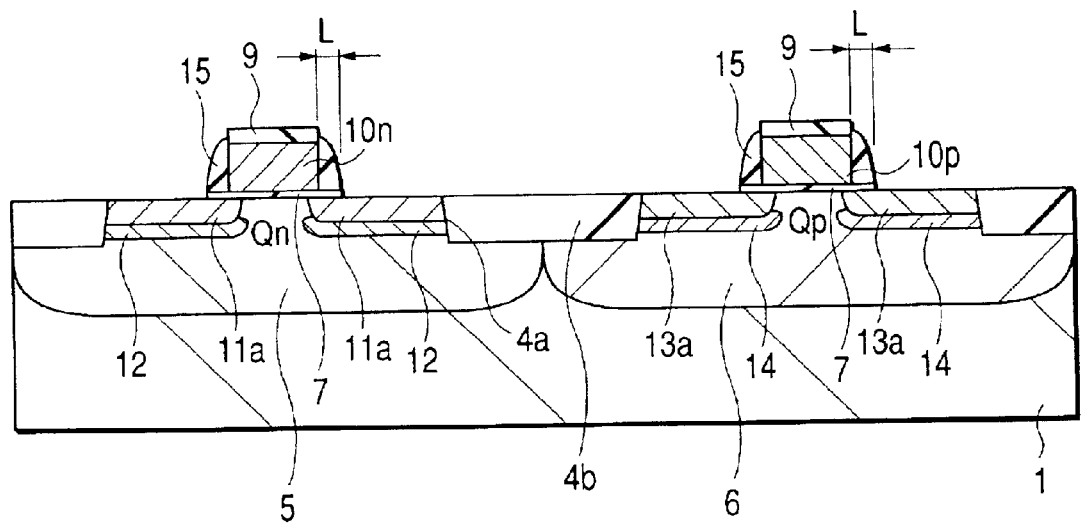
FIG. 8 is a fragmentary cross-sectional view illustrating a manufacturing method of the semiconductor substrate showing the CMOS device according to Embodiment 1 of the present invention.

As illustrated in FIG. 8, a silicon oxide film deposited over the substrate 1 by CVD is anisotropically etched by RIE (Reactive Ion Etching) to form side wall spacers 15 on the side surfaces (walls) of each of the gate electrode 10n of the n channel type MISFETQn and the gate electrode 10p of the p channel type MISFETQp. It should be noted that the side wall spacers 15 are processed to have a spacer length L of 0.07 $\mu$m or less.

Figure 9A:
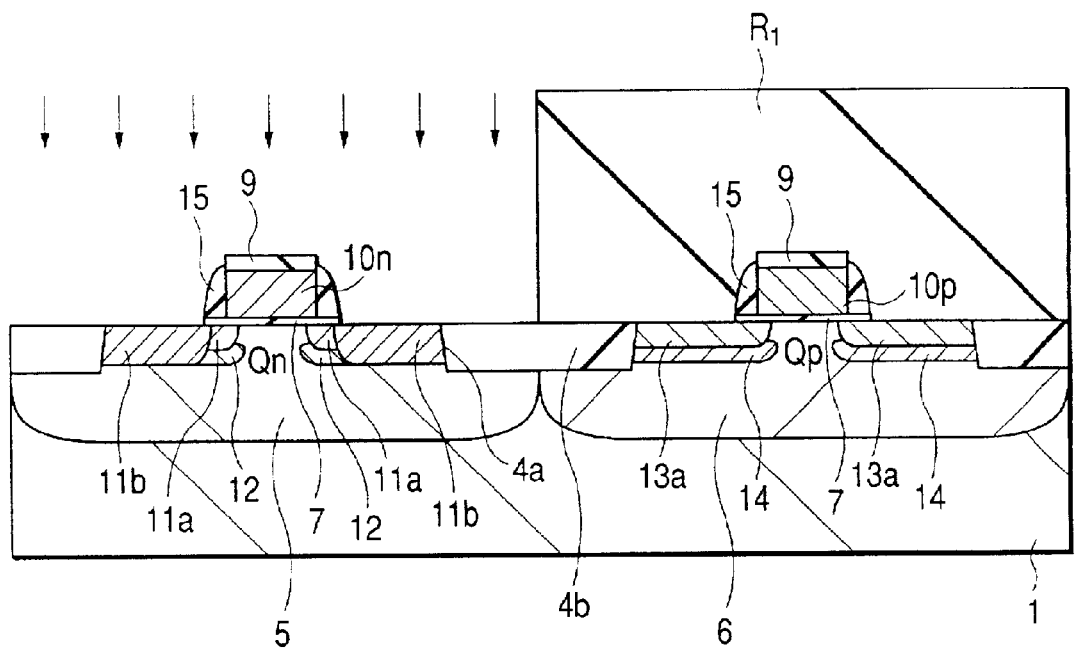
FIGS. 9(a) and 9(b) are fragmentary cross-sectional views each illustrating a manufacturing method of the semiconductor substrate showing the CMOS device according to Embodiment 1 of the present invention.

As illustrated in FIG. 9, after covering the n-type well 6 with a resist film R$_1$, ions of an n-type impurity, for example, As are implanted to the p-type well 5 in self alignment with the gate electrode 10n and the side wall spacers 15 of the n channel type MISFETQn to form source/drain diffused regions 11b of the n channel type MISFETQn (FIG. 9(a)). The As ions are implanted, for example, at an energy of 40 keV and dose of $2 \times 10^{15}$ cm$^{-2}$.

Figure 9B:
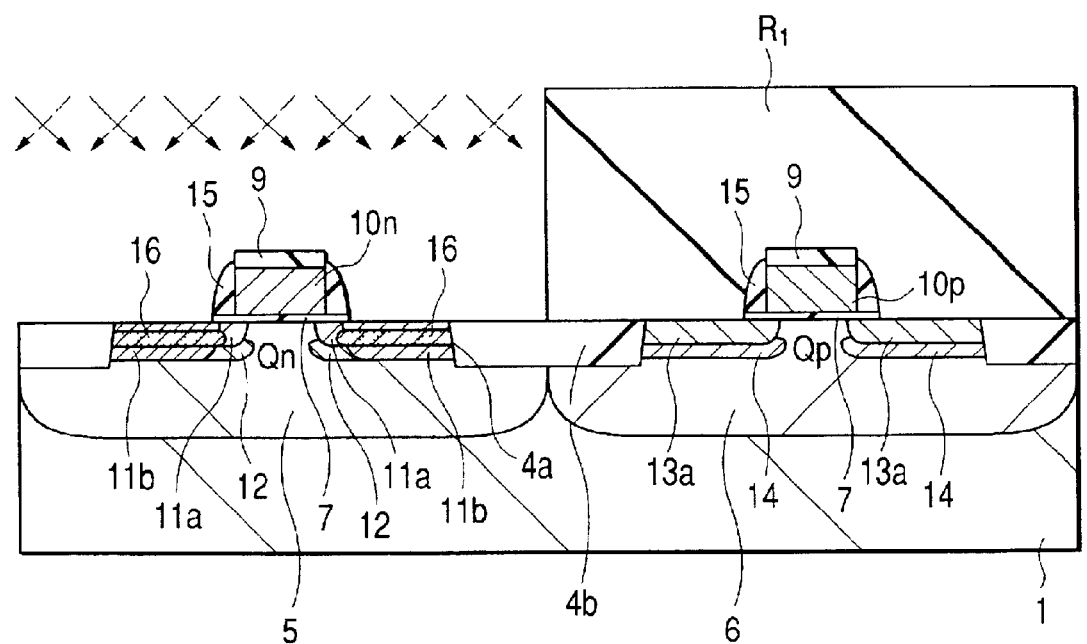

An n-type semiconductor region 16 is then formed at a position of about 20 to 40 nm deep from the surface of the substrate 1 by implanting ions of an n-type impurity, for example, As (FIG. 9(b)). The As ions are injected by oblique implantation from four directions having an inclination of about 45 degree relative to the normal line of the substrate 1. Implantation from one direction is conducted, for example, at an energy of 25 keV and dose of $1\times10^{14}$ cm$^{-2}$. The n-type semiconductor region 16 is formed in self alignment with the gate electrode 10n and side wall spacers 15.

Figure 10A:
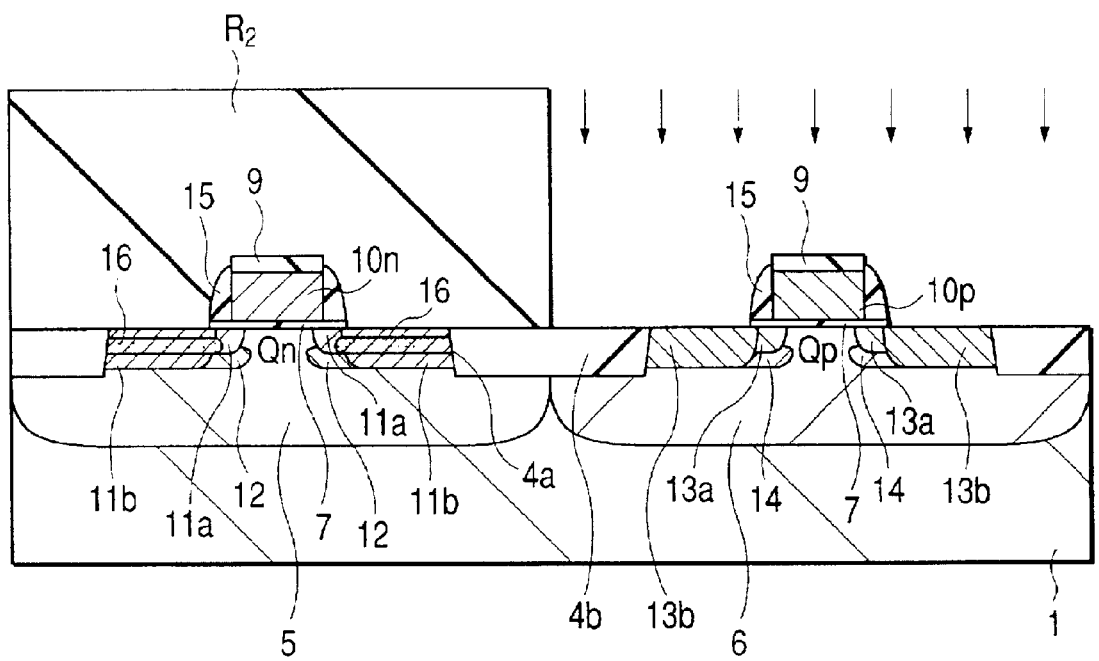
FIGS. 10(a) and 10(b) are fragmentary cross-sectional views each illustrating a manufacturing method of the semiconductor substrate showing the CMOS device according to Embodiment 1 of the present invention.

After removal of the resist film R$_1$, the source/drain diffused regions 13b of the p channel type MISFETQp are formed, as in the above-described manner, as illustrated in FIG. 10, by implanting ions of an n-type impurity, for example, BF$_2$ into the n-type well 6 in self alignment with the gate electrode 10p and side wall spacers 15 of the p channel type MISFETQp (FIG. 10(a)). The BF$_2$ ions are implanted, for example, at an energy of 25 keV and dose of $2\times10^{15}$ cm$^{-2}$.

Figure 10B:
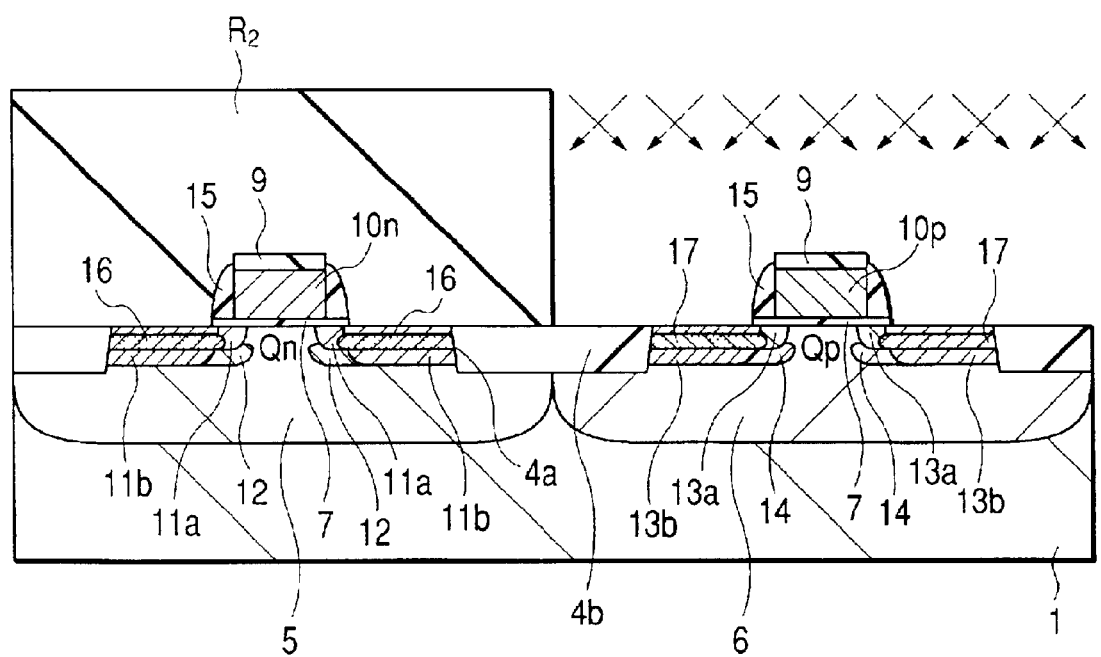

A p-type semiconductor region 17 is then formed at a position about 20 to 40 nm deep from the surface of the substrate 1 by implanting ions of a p-type impurity, for example, BF$_2$ (FIG. 10(b)). The BF$_2$ ions are implanted obliquely from four directions having an inclination of about 45 degree relative to the normal line of the substrate 1. Implantation from one direction is conducted, for example, at an energy of 25 keV and dose of $1\times10^{14}$ cm$^{-2}$. The p-type semiconductor region 17 is formed in self alignment with the gate electrode 10p and side wall spacers 15.

The resist film R$_2$ is then removed, followed by heat treatment of the substrate 1 at 1000° C. for about 5 seconds, whereby the n-type impurity and p-type impurity implanted to the substrate 1 are activated.

Figure 11:
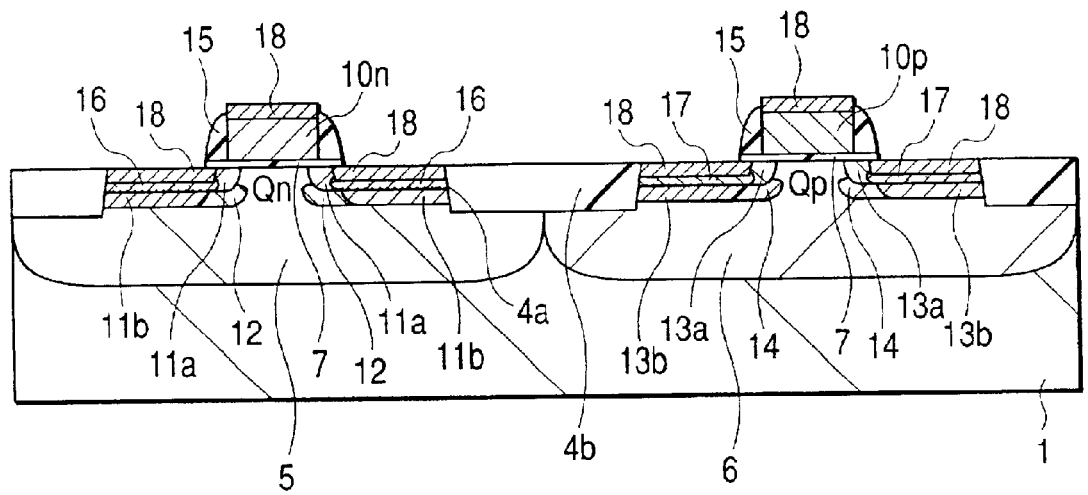
FIG. 11 is a fragmentary cross-sectional view illustrating a manufacturing method of the semiconductor substrate showing the CMOS device according to Embodiment 1 of the present invention.

As illustrated in FIG. 11, after cleaning the substrate 1 with a hydrofluoric acid (HF) solution, a Co film of about 10 to 20 nm thick is deposited over the substrate 1 by sputtering. The present invention embraces a high refractory metal film such as Ti film instead of the Co film. The substrate 1 is then heat treated at about 500 to 600° C. to form a silicide layer 18 of about 30 nm thick selectively over each of the surfaces of the gate electrode 10n and source/drain diffused regions 11b of the n channel type MISFETQn and the surfaces of the gate electrode 10p and source/drain diffused regions 13b of the p channel type MISFETQp. Then, an unreacted portion of the Co film is removed, followed by heat treatment of the substrate 1 at about 700 to 800° C. for reducing the resistance of the silicide layer 18.

In the above-described cleaning treatment, it is possible not to completely remove the silicon oxide film 9 but to leave it as is over the gate electrode 10n of the n channel type MISFETQn and the gate electrode 10p of the p channel type MISFETQp. In this case, silicide layer is not introduced into each of the surface of the n-type polycrystalline silicon film 8n constituting the gate electrode 10n and the surface of the p-type polycrystalline silicon film 8p constituting the gate electrode 10p. A reduction in the resistance of the gate electrodes 10n, 10p may therefore be effected by constituting the gate electrode 10n from a stack of a metal film and the n-type polycrystalline silicon film or a metal silicide film and the n-type polycrystalline film and the gate electrode 10p from a stack of a metal film and the p-type polycrystalline silicon film or a metal silicide film and the p-type polycrystalline silicon film.

Figure 12:
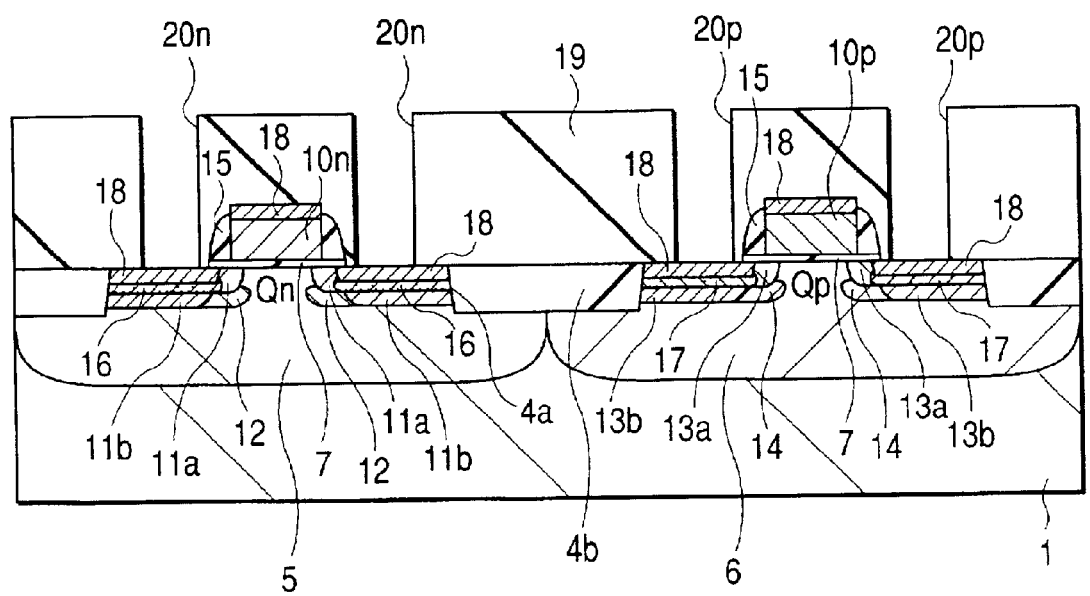
FIG. 12 is a fragmentary cross-sectional view illustrating a manufacturing method of the semiconductor substrate showing the CMOS device according to Embodiment 1 of the present invention.

As illustrated in FIG. 12, after formation of an interlevel insulating film 19 over the substrate 1, the interlevel insulating film 19 is etched with a resist pattern as a mask to open contact holes 20n reaching the silicide layer 18 formed over the surface of the source/drain diffused regions 11b of the n channel type MISFETQn and contact holes 20p reaching the silicide layer 18 formed over the surface of the source/drain diffused regions 13b of the p channel type MISFETQp. At the same time, contact holes which reach the silicide layer 18 formed on the surface of the gate electrode 10n of the n channel type MISFETQn and the silicide layer 18 formed on the surface of the gate electrode 10p of the p channel type MISFETQp are formed, which are however not illustrated.

Figure 13:
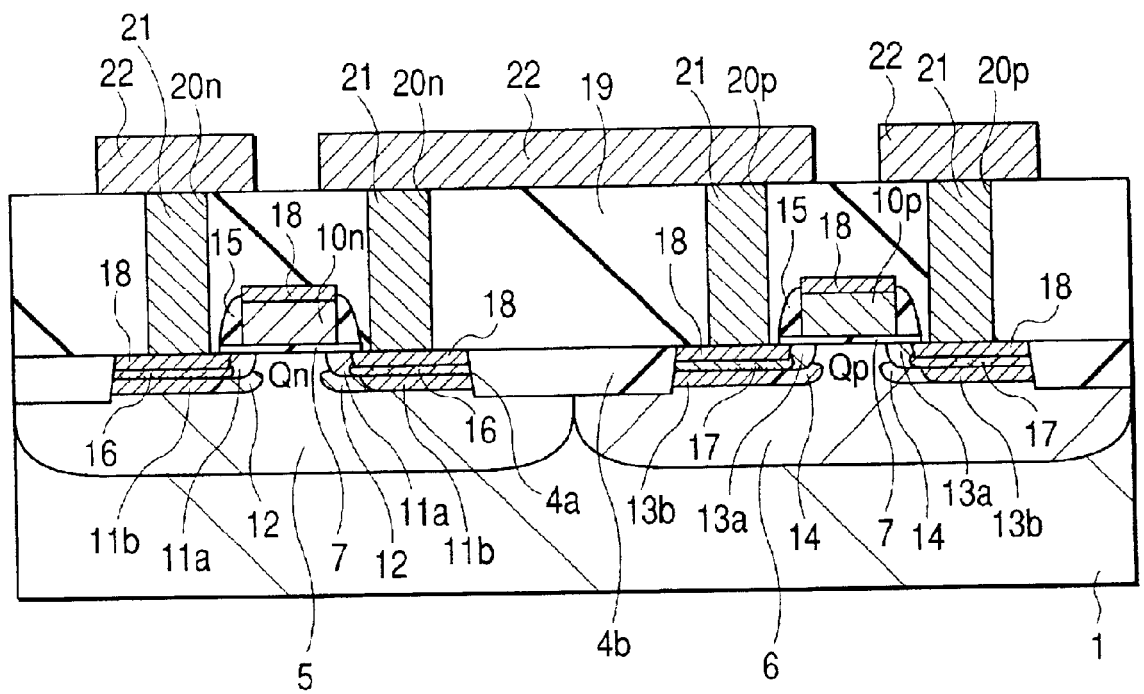
FIG. 13 is a fragmentary cross-sectional view illustrating a manufacturing method of the semiconductor substrate showing the CMOS device according to Embodiment 1 of the present invention.

As illustrated in FIG. 13, a metal film, for example, a tungsten (W) film is deposited over the interlevel insulating film 19, followed by planarization of the surface of this metal film, for example, by CMP, whereby the metal film is embedded inside of the contact holes 20n, 20p to form plugs 21. The metal film deposited over the interlevel insulating film 19 is then etched to form a wiring layer 22, whereby a CMOS device is substantially completed.

Figure 14:
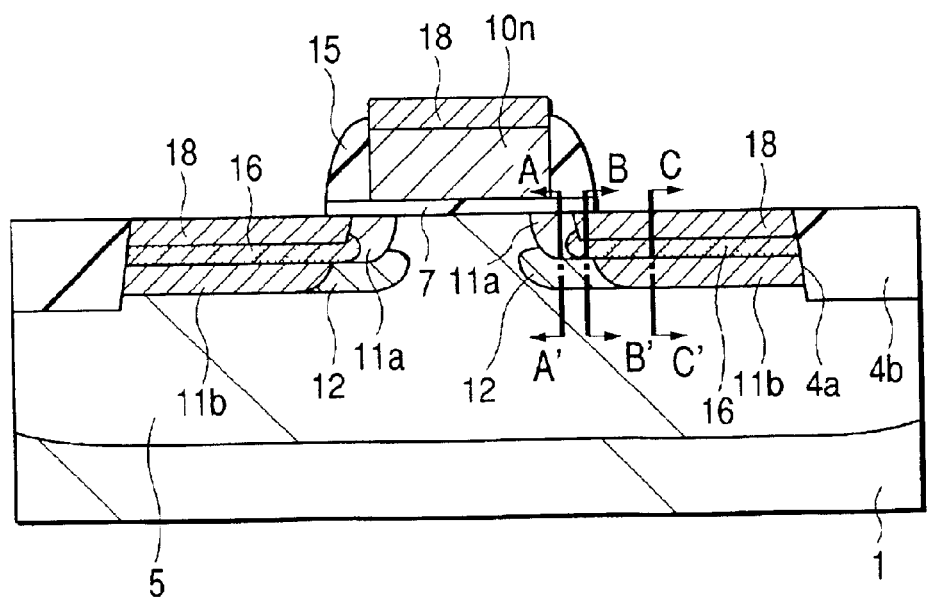
FIG. 14 is an enlarged cross-sectional view illustrating an n channel type MISFET according to Embodiment 1 of the present invention.

FIG. 14 illustrates an enlarged cross-sectional view of the n channel type MISFETQn and FIG. 15 illustrates one example of the concentration profile of each of the n-type impurity and p-type impurity introduced into the substrate 1 taken along lines A–A', B–B' and C–C' of FIG. 14.

Figure 15A:
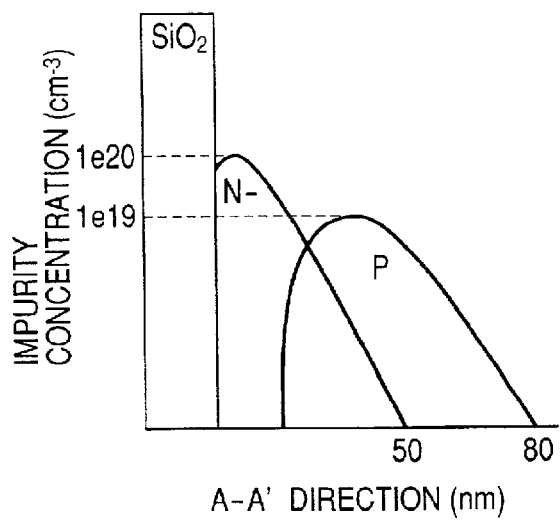
FIGS. 15(a) to 15(c) show one example of an impurity concentration profile taken along lines A–A', B–B' and C–C' of FIG. 14.

In the substrate 1 (line A–A') below the side wall spacers 15, formed are source/drain extended regions 11a having a concentration profile (N–) with a peak at about $1\times10^{20}$ cm$^{-3}$ and pocket region 12 which is in contact with the lower portion of the source/drain extended regions 11a and shows a concentration profile (P) with a peak at about $1\times10^{19}$ cm$^{-3}$ (FIG. 15(a)).

Figure 15B:
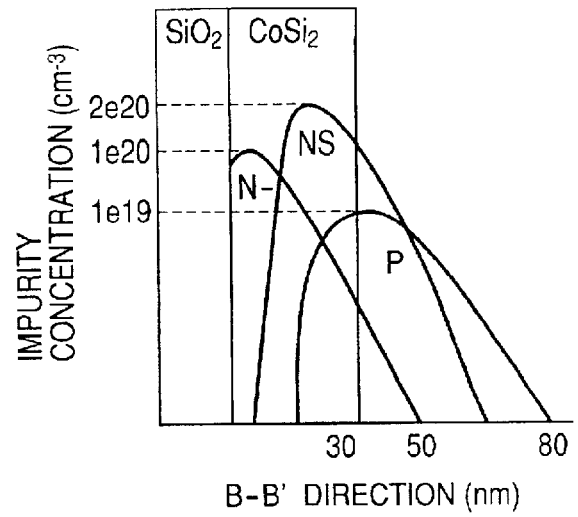

In the substrate 1 (line B–B') in the vicinity of the end portion of the side wall spacers 15, formed are source/drain extended regions 11a having a concentration profile (N–) with a peak at about $1\times10^{20}$ cm$^{-3}$, pocket region 12 which is in contact with the lower portion of the source/drain extended regions 11a and shows a concentration profile (P) with a peak at about $1\times10^{19}$ cm$^{-3}$, and n-type semiconductor region 16 having a concentration of about $1\times10^{20}$ cm$^{-3}$ at the end portion of the silicide layer 18 and having a peak concentration profile (NS) of about $2\times10^{20}$ cm$^{-3}$ (FIG. 15(b)).

Figure 15C:
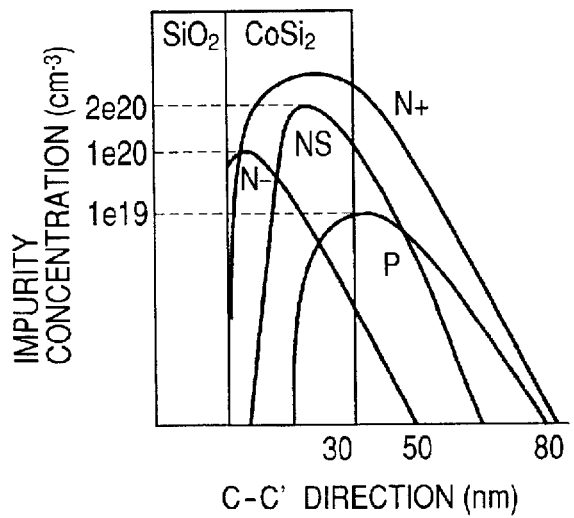

In a region of the substrate 1 (line C–C') wherein neither gate electrode 10 nor side wall spacers 15 are formed, formed are source/drain extended regions 11a having a concentration profile (N–) with a peak at about $1\times10^{20}$ cm$^{-2}$, pocket region 12 which is in contact with the lower portion of the source/drain extended regions 11 and has a concentration profile (P) with a peak at about $1\times10^{19}$ cm$^{-3}$, n-type semiconductor region 16 having a concentration of about $1\times10^{20}$ cm$^{-3}$ at the end portion of the silicide layer 18 and having a concentration profile (NS) with a peak at about $2\times10^{20}$ cm$^{-3}$; and source/drain diffused regions 11b which are arranged at a position deeper than the n-type semiconductor region 16 and have a concentration profile (N+) with a peak at $2\times10^{20}$ cm$^{-3}$ or greater (FIG. 15(c)).

FIG. 16 is another example of the concentration profile, taken along lines A–A', B–B' and C–C' of FIG. 14, of each of the n-type impurities and p-type impurities introduced into the substrate 1.

Figure 16A:
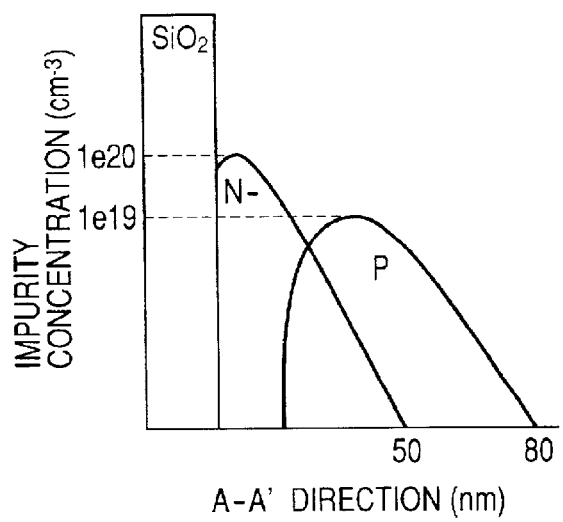
FIGS. 16(a) to 16(c) show another example of an impurity concentration profile taken along lines A–A', B–B' and C–C' of FIG. 14.

In the substrate 1 (line A–A') below the side wall spacers 15, formed are source/drain extended regions 11a which have a concentration profile (N–) with a peak at about $1\times10^{20}$ cm$^{-3}$ and pocket region 12 which is in contact with the lower portion of the source/drain extended regions 11a and has a concentration profile (P) with a peak at about $1\times10^{19}$ cm$^{-3}$ (FIG. 16(a)).

Figure 16B:
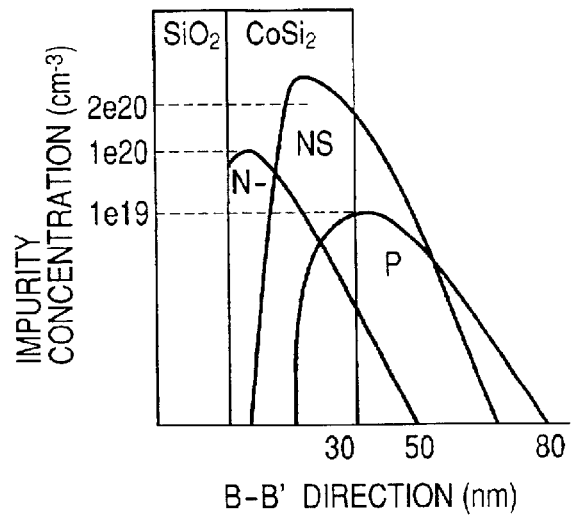

In the substrate 1 (line B–B') in the vicinity of the end portion of the side wall spacers 15, formed are source/drain extended regions 11a having a concentration profile (N−) with a peak at about $1\times10^{20}$ cm$^{-3}$; pocket region 12 which is in contact with the lower portion of the source/drain extended regions 11a and has a concentration profile (P) with a peak at about $1\times10^{19}$ cm$^{-3}$; and n-type semiconductor region 16 having a concentration of $1\times10^{20}$ cm$^{-3}$ or greater at the end portion of the silicide layer 18 and having a concentration profile (NS) with a peak at about $2\times10^{20}$ cm$^{-3}$ (FIG. 16(b)).

Figure 16C:
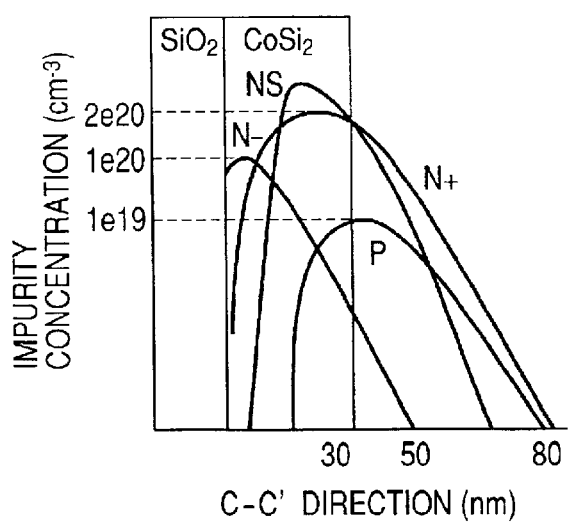

In a region of the substrate 1 (line C–C') wherein neither gate electrode 10 nor side wall spacers 15 are formed, formed are source/drain extended regions 11a having a concentration profile (N−) with a peak at about $1\times10^{20}$ cm$^{-2}$, pocket region 12 which is in contact with the lower portion of the source/drain extended regions 11 and has a concentration profile (P) with a peak at about $1\times10^{19}$ cm$^{-3}$, n-type semiconductor region 16 having a concentration of $1\times10^{20}$ cm$^{-3}$ or greater at the end portion of the silicide layer 18 and having a concentration profile (NS) with a peak at $2\times10^{20}$ cm$^{-3}$ or greater; and source/drain diffused regions 11b which are formed at a position deeper than the n-type semiconductor region 16 and have a concentration profile (N+) with a peak at about $2\times10^{20}$ cm$^{-3}$ (FIG. 16(c)).

As illustrated in FIGS. 15 and 16, no particular limitation is imposed on the relation in the size of the peak concentration between the source/drain diffused regions 11b and the n-type semiconductor region 16.

However, the junction depth ($Xj_{N-}$) of the source/drain extended regions 11a is set smaller than the junction depth ($Xj_{NS}$) of the n-type semiconductor region 16 and the junction depth ($Xj_{NX}$) of the n-type semiconductor region 16 is set smaller than the junction depth ($Xj_{N+}$) of the source/drain diffused regions 11b. In short, the below-described equation (2) is satisfied.

$$Xj_{N-} < Xj_{NX} < Xj_{N+} \quad \text{Equation} \quad (2)$$

In addition, the impurity concentration ($C_{NS}$) of the semiconductor region 16 is set higher than the impurity concentration ($C_{N-}$) of the source/drain extended regions 11a and/or the impurity concentration ($C_{NS}$) of the semiconductor region 16 is set not exceeding the impurity concentration ($C_{N+}^{-}$) of the source/drain diffused regions 11b. In short, the below-described equation (3) is satisfied.

$$C_{N-} < C_{NX} \text{ and/or } C_{NS} \leq C_{N+} \quad \text{Equation} \quad (3)$$

At the end portion of the silicide layer 18 which exists in the substrate 1 (line B–B') in the vicinity of the end portion of the side wall spacers 15, the n-type semiconductor region 16 having a concentration of about $1\times10^{20}$ cm$^{-3}$ or greater is formed and with this n-type semiconductor region 16, a portion or the whole portion of the end portion of the silicide layer 18 is surrounded. In other words, the source/drain extended regions 11a, n-type semiconductor region 16, silicide layer 18, source/drain diffused regions 11b lie in the order of mention from the channel region toward the end portion of the side wall spacers 15.

Below the silicide layer 18 on the substrate (line C–C') on which neither gate electrode 10n nor side wall spacers 15 is formed, the n-type semiconductor region 16 or source/drain diffused regions 11b having a concentration of about $1\times10^{20}$ cm$^{-3}$ or greater are formed.

In this Embodiment 1, an n-type impurity is introduced (injected) by ion-implantation from four directions at an inclination of about 45 degree relative to the normal line of the substrate 1 upon formation of the n-type semiconductor region 16 of the n channel type MISFETQn. The inclination of the ion injection is not limited to about 45 degree. It is only necessary to inject the n-type impurity at an inclination permitting the formation of the n-type semiconductor region 16 to surround a portion or the whole portion of the end portion of the silicide layer 18 which lies in the vicinity of the end portion of the side wall spacers 15. Also upon formation of the p-type semiconductor region 17 of the p channel type MISFETQp, the inclination of ion injection is not limited to about 45 degree.

In this Embodiment 1, as described above, the n-type semiconductor region 16 is formed between the source/drain extended regions 11a and source/drain diffused regions 11b of the n channel type MISFETQn; a portion or the whole portion of the end portion of the silicide layer 18 formed on the surface of the substrate 1 is surrounded by the n-type semiconductor region 16; and the concentration of the n-type semiconductor region 16 in contact with the silicide layer 18 is set at about $1\times10^{20}$ cm$^{-3}$. Similarly, the p-type semiconductor region 17 is formed between the source/drain extended regions 13a and source/drain diffused regions 13b of the p channel type MISFETQn; a portion or the whole portion of the end portion of the silicide layer 18 formed on the surface of the substrate 1 is surrounded by the p-type semiconductor region 17; and the concentration of the p-type semiconductor region 17 in contact with the silicide layer 18 is set at about $1\times10^{20}$ cm$^{-3}$. This structure lessens the contact resistance between the silicide layer 18 and the n-type semiconductor region 16 and that between the silicide layer 18 and the p-type semiconductor region 17, making it possible to relax a voltage drop when an electric current flows from the silicide layer 18 to the source/drain extended regions 11a, 13a.

(Embodiment 2)

A CMOS device according to another embodiment of the present invention will next be described based on FIGS. 17 to 24.

In a similar manner to Embodiment 1 which was described based on FIGS. 1 to 7, over the main surface of a substrate 1, a gate insulating film 7, gate electrode 10n, source/drain extended regions 11a and pocket layer 12 of an n channel type MISFETQn are formed, while a gate insulating film 7, gate electrode 10p, source/drain extended regions 13a and pocket layer 14 of a p channel type MISFETQp are formed.

Figure 17:
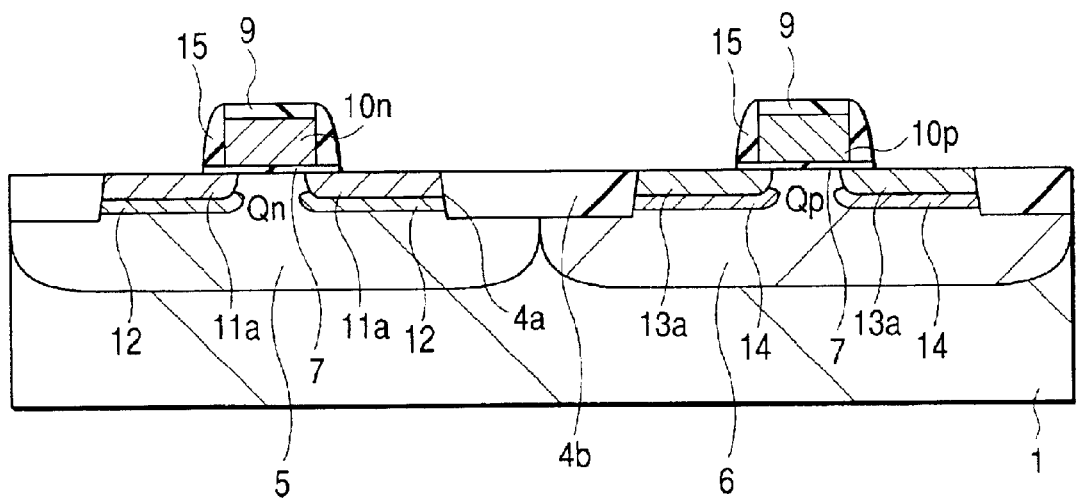
FIG. 17 is a fragmentary cross-sectional view illustrating a manufacturing method of a semiconductor substrate showing a CMOS device according to Embodiment 2 of the present invention.
Figure 18:
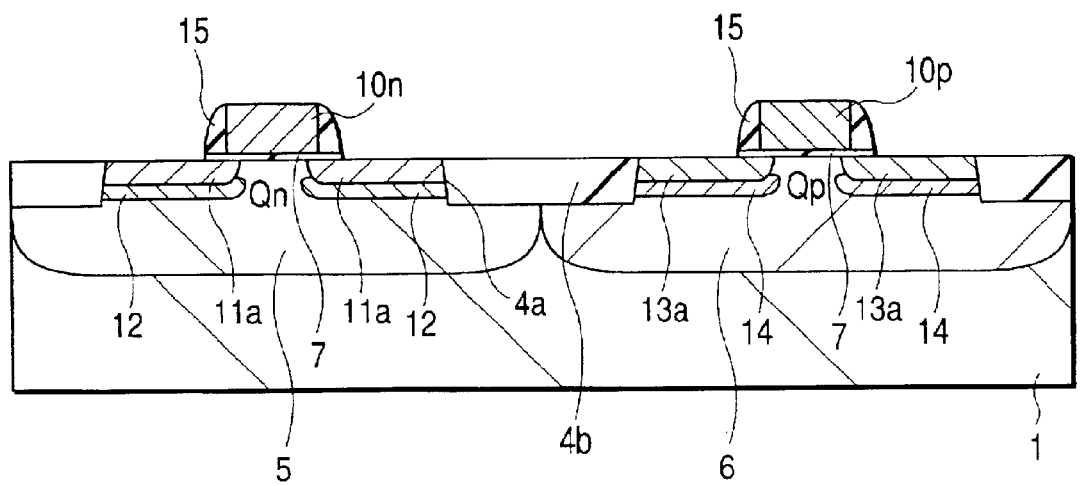
FIG. 18 is a fragmentary cross-sectional view illustrating a manufacturing method of the semiconductor substrate showing the CMOS device according to Embodiment 2 of the present invention.

As illustrated in FIG. 17, after deposition of a silicon oxide film of about 150 nm thick over the substrate by CVD, this silicon oxide film is anisotropically etched by RIE, whereby side wall spacers 15 are formed on the side walls of each of the gate electrode 10n of the n channel type MISFETQn and the gate electrode 10p of the p channel type MISFETQp. In this Embodiment 2, a silicon oxide film 9 is formed over the gate electrodes 10n, 10p, but as illustrated in FIG. 18, the silicon oxide film 9 may be removed completely upon the above-described anisotropic etching to expose the surface of each of the gate electrodes 10n, 10p.

Figure 19:
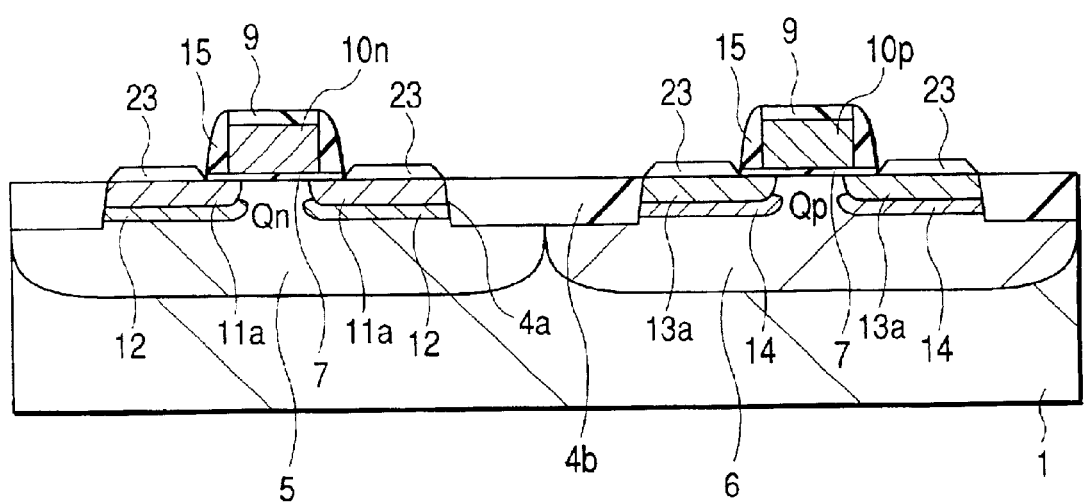
FIG. 19 is a fragmentary cross-sectional view illustrating a manufacturing method of the semiconductor substrate showing the CMOS device according to Embodiment 2 of the present invention.

A illustrated in FIG. 19, an Si epitaxial layer 23 is deposited over the substrate 1 by selective CVD. The thickness of this Si epitaxial layer 23 is, for example, about 50 nm and Ge may be mixed in the Si epitaxial layer 23.

Figure 20A:
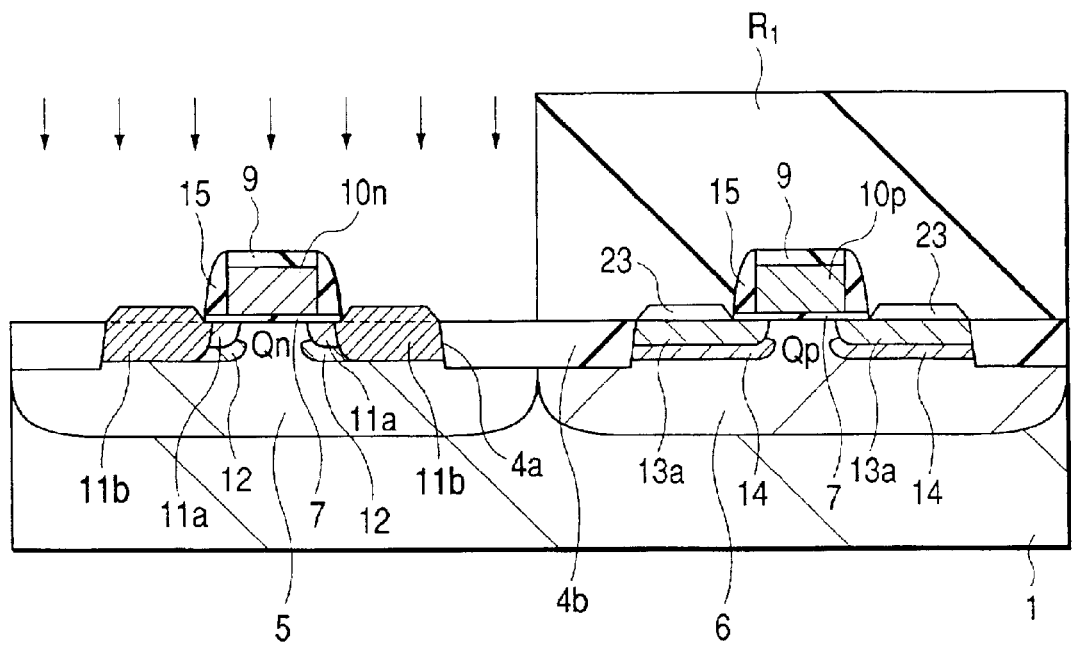
FIGS. 20(a) and 20(b) are fragmentary cross-sectional views illustrating a manufacturing method of the semiconductor substrate showing the CMOS device according to Embodiment 2 of the present invention.
Figure 20B:
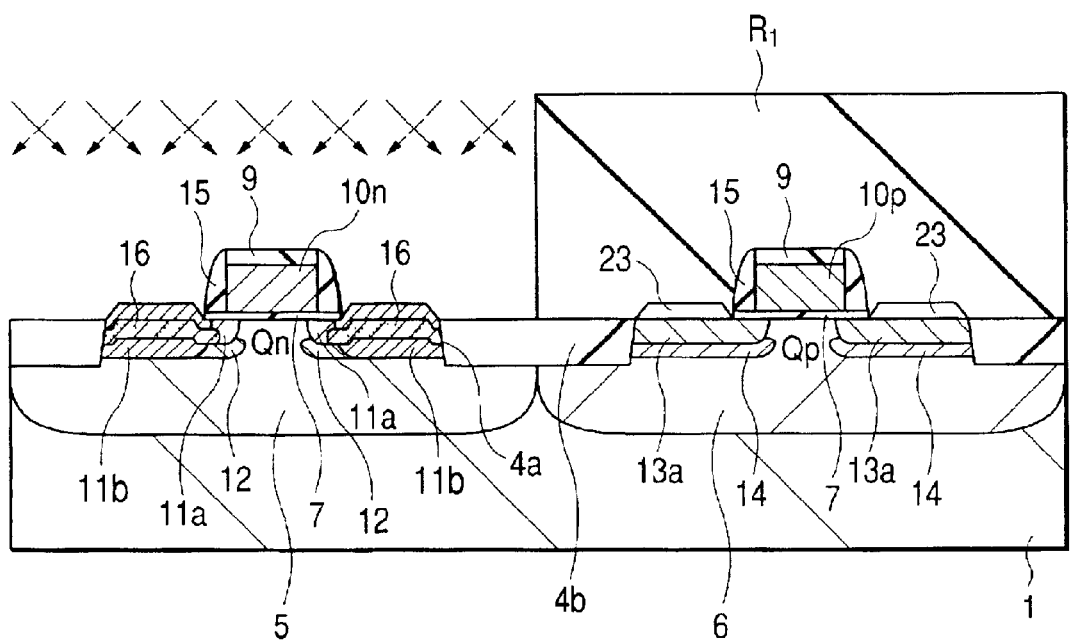

As illustrated in FIG. 20, after covering an n-type well 6 with a resist film $R_1$, ions of an n-type impurity, for example, As are injected to the Si epitaxial layer 23 and p-type well 5 in self alignment with the gate electrode 10n and side wall spacers 15 of the n channel type MISFETQn, whereby source/drain diffused regions 11b of the n channel type MISFETQn are formed (FIG. 20(a)). The above-described As ions are injected, for example, at an energy of 40 keV and dose of $2\times10^{15}$ cm$^{-2}$.

Then, ions of an n-type impurity, for example, As are injected to form an n-type semiconductor region 16 at the position of about 20 to 40 nm deep from the surface of the Si epitaxial layer 23. The As ions are injected by implantation from four directions having, for example, an inclination of about 45 degree relative to the normal line direction of the substrate 1. Injection from one direction is conducted at an energy of 25 kev and dose of $1\times10^{14}$ cm$^{-2}$. The n-type semiconductor region 16 is formed in self alignment with the gate electrode 10n and side wall spacers 15.

Figure 21A:
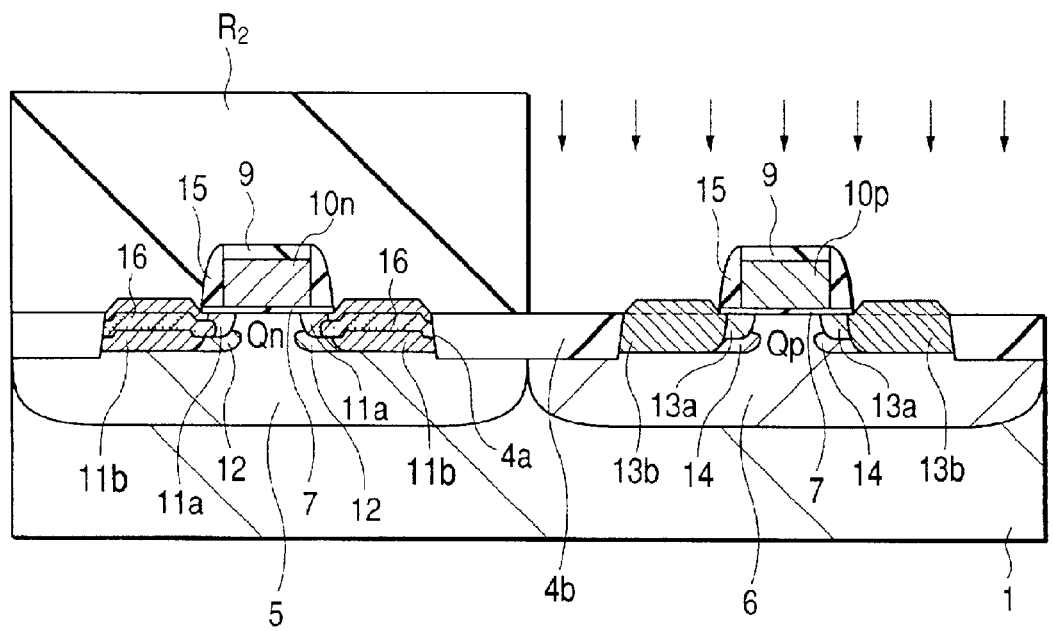
FIGS. 21(a) and 21(b) are fragmentary cross-sectional views illustrating a manufacturing method of the semiconductor substrate showing the CMOS device according to Embodiment 2 of the present invention.

After removal of the resist film $R_1$, the p-type well 5 is similarly covered with a resist film $R_2$ as illustrated in FIG. 21. Then, ions of a p-type impurity, for example, $BF_2$ are injected to the Si epitaxial layer 23 and n-type well 6 in self alignment with the gate electrode 10P and side wall spacers 15 of the p channel type MISFETQp, whereby source/drain diffused regions 13b of the p channel type MISFETQp are formed (FIG. 21(a)). The above-described $BF_2$ is injected, for example, at an energy of 25 keV and a dose of $2\times10^{15}$ cm$^{-2}$.

Figure 21B:
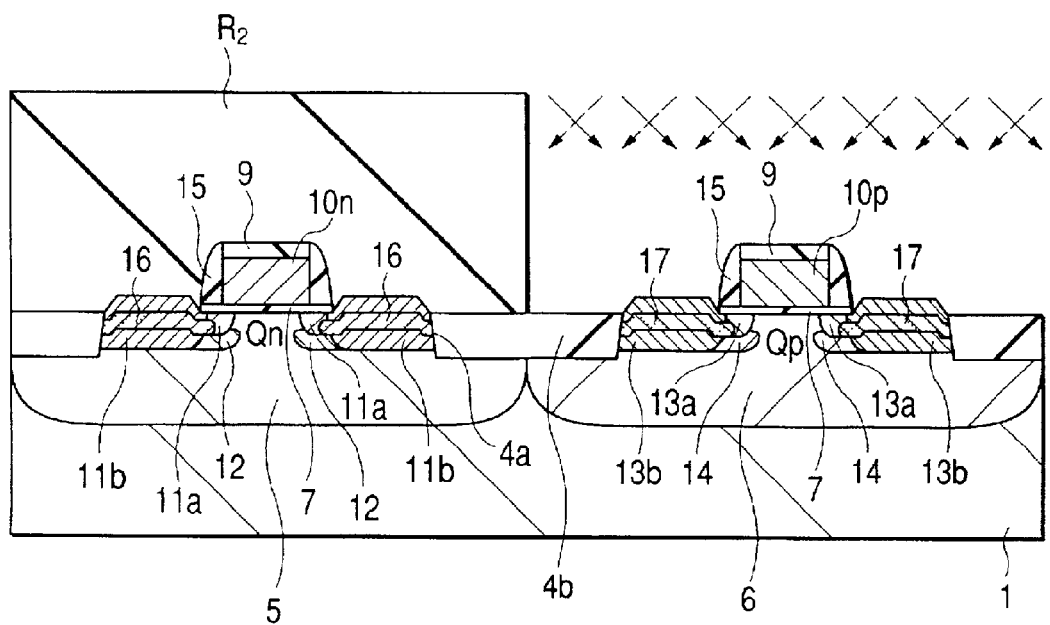

Then, ions of a p-type impurity, for example, $BF_2$ are injected to form a p-type semiconductor region 17 at the position of about 20 to 40 nm deep from the surface of the Si epitaxial layer 23 (FIG. 21(b)). The $BF_2$ is injected by oblique implantation from 4 directions having, for example, an inclination of about 45 degree relative to the normal line direction of the substrate 1. Injection from one direction is conducted at an energy of 25 kev and dose of $1\times10^{14}$ cm$^{-2}$. The p-type semiconductor region 17 is formed in self alignment with the gate electrode 10p and side wall spacers 15.

Then, the resist film $R_2$ is removed, followed by heat treatment of the substrate 1 at 1000° C. for about 5 seconds to activate the n-type impurity and p-type impurity injected to the substrate 1 and epitaxial layer 23.

Figure 22:
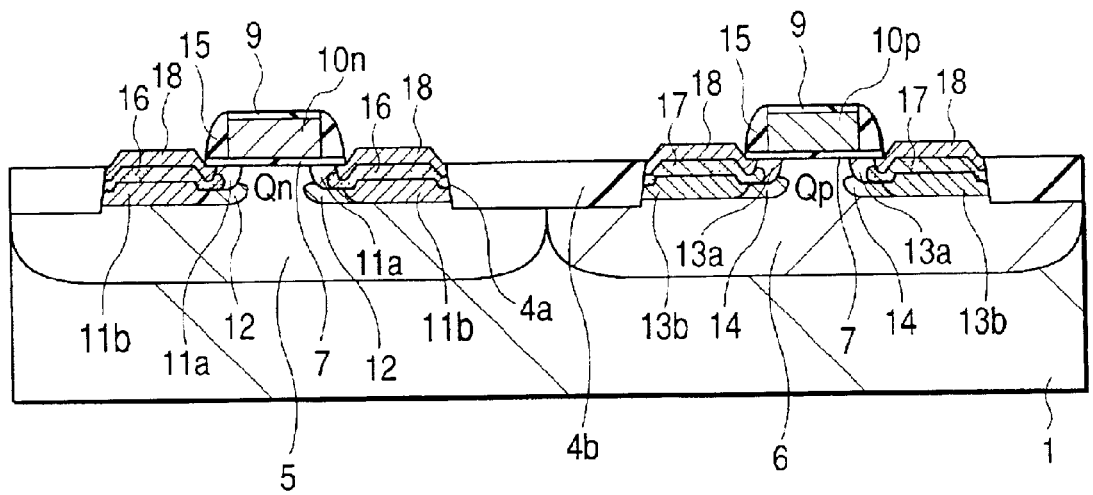
FIG. 22 is a fragmentary cross-sectional view illustrating a manufacturing method of the semiconductor substrate showing the CMOS device according to Embodiment 2 of the present invention.

As illustrated in FIG. 22, after cleaning the substrate with an HF solution, a Co film of about 10 to 20 nm thick is deposited over the substrate 1 by sputtering. The substrate 1 is then subjected to heat treatment at about 500 to 600° C. to selectively form a silicide layer 18 of about 30 nm thick over each of the surface of the source/drain diffused regions 11b of the n channel type MISFETQn and the surface of the source/drain diffused regions 13b of the p channel type MISFETQp. An unreacted portion of the Co film is then removed, followed by heat treatment of the substrate 1 at about 700 to 800° C. in order to reduce the resistance of the silicide layer 18.

Figure 23:
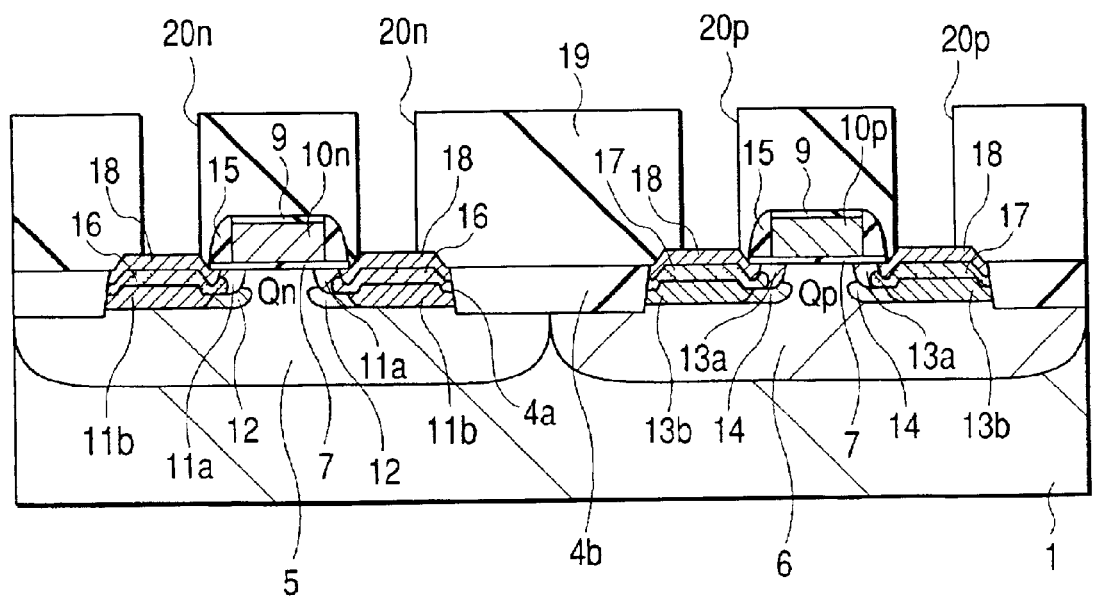
FIG. 23 is a fragmentary cross-sectional view illustrating a manufacturing method of the semiconductor substrate showing the CMOS device according to Embodiment 2 of the present invention.

As illustrated in FIG. 23, after formation of an interlevel insulating film 19 over the substrate 1, the interlevel insulating film 19 is etched with a resist pattern as a mask, whereby contact holes 20n reaching the silicide layer 18 formed on the surface of the source/drain diffused regions 11b of the n channel type MISFETQn and contact holes 20p reaching the silicide layer 18 formed on the surface of the source/drain diffused regions 13b of the p channel type MISFETQp are formed. At the same time, contact holes which reach the gate electrode 10n of the n channel type MISFETQn and the gate electrode 10p of the p channel type MISFETQp are formed, which are however not illustrated.

Figure 24:
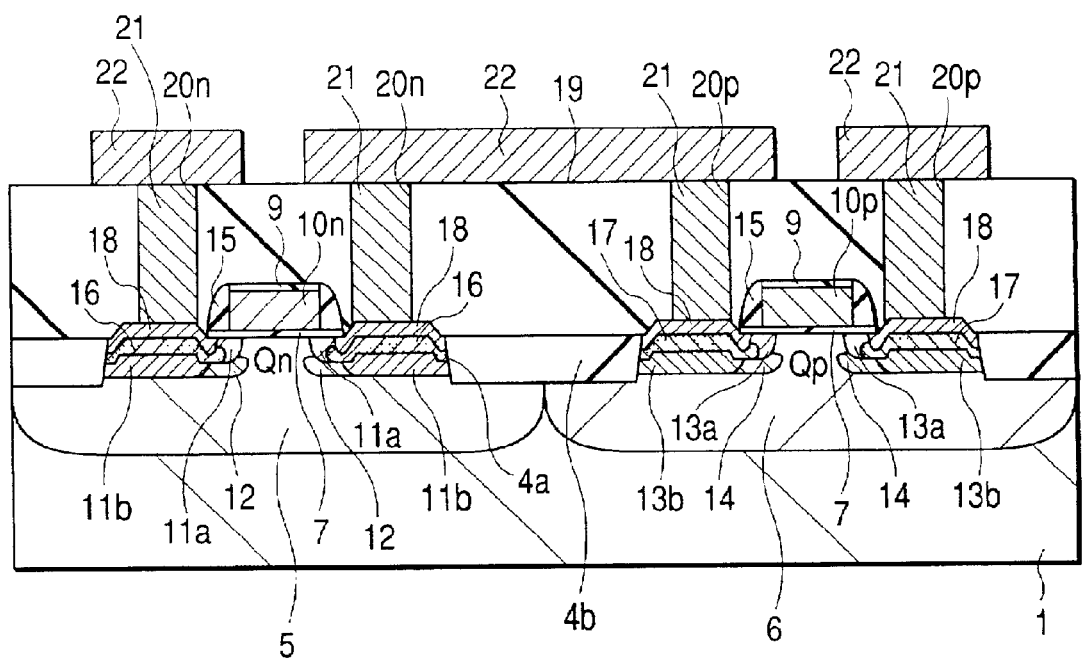
FIG. 24 is a fragmentary cross-sectional view illustrating a manufacturing method of the semiconductor substrate showing the CMOS device according to Embodiment 2 of the present invention.

As illustrated in FIG. 24, a metal film, for example, a W film is deposited over the interlevel insulating film 19, followed by planarization of the surface of this metal film, for example, by CMP, whereby the metal film is embedded inside of the contact holes 20n, 20p to form plugs 21. The metal film deposited over the interlevel insulating film 19 is then etched to form a wiring layer 22, whereby a CMOS device is substantially completed.

Figure 25:
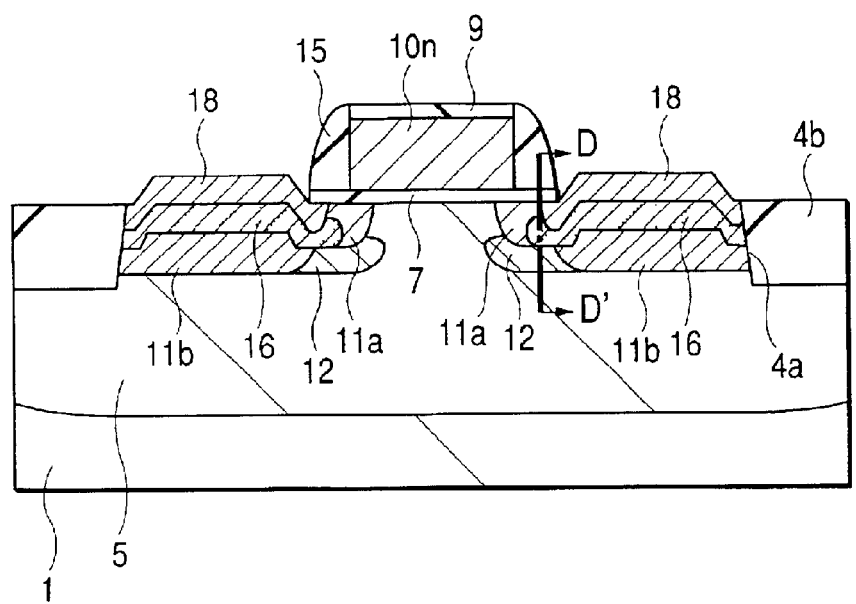
FIG. 25 is an enlarged cross-sectional view of an n channel type MISFET according to Embodiment 2 of the present invention.
Figure 26:
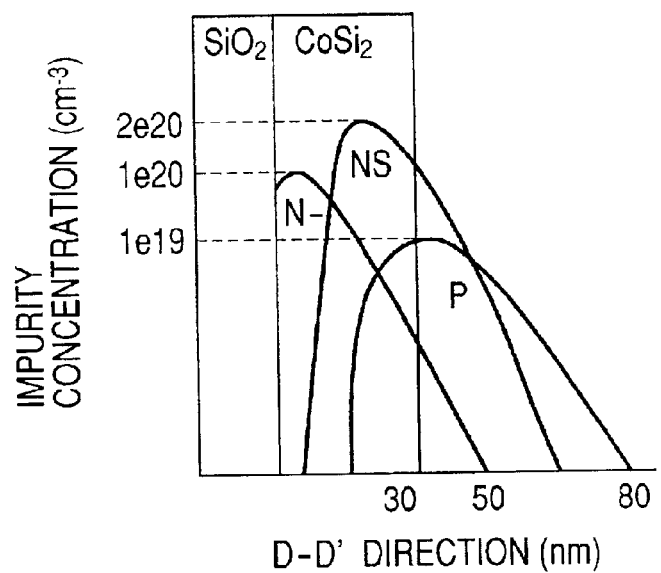
FIG. 26 is one example of an impurity concentration profile taken along a line D–D' of FIG. 25.

FIG. 25 illustrates an enlarged cross-sectional view of the n channel type MISFETQn and FIG. 26 illustrates one example of the concentration profile, taken along line D–D' of FIG. 25, of each of the n-type impurity and p-type impurity introduced into the substrate 1.

In the CMOS device of this embodiment, as in the CMOS device described in Embodiment 1, in the substrate 1 in the vicinity of the end portion of the side wall spacers 15, formed are source/drain extended regions 11a having a concentration profile (N–) with a peak at about $1\times10^{20}$ cm$^{-3}$, pocket region 12 which is in contact with the lower portion of the source/drain extended regions 11a and has a concentration profile (P) with a peak at about $1\times10^{19}$ cm$^{-3}$, and n-type semiconductor region 16 having a concentration of about $1\times10^{20}$ cm$^{-3}$ at the end portion of the silicide layer 18 and having a concentration profile (NS) of about $2\times10^{20}$ cm$^{-3}$.

In other words, at the end portion of the silicide layer 18 existing in the substrate 1 in the vicinity of the end portion of the side wall spacers 15, the n-type semiconductor region 16 having a concentration of about $1\times10^{20}$ cm$^{-3}$ is formed and a portion or the whole portion of the end portion of the silicide layer 18 is surrounded by this n-type semiconductor region 16.

According to this Embodiment 2, similar to Embodiment 1, since the contact resistance between the n-type semiconductor region 16 and silicide layer 18 of the n channel type MISFETQn and that between the p-type semiconductor region 17 and silicide layer 18 of the p channel type MISFETQp are lessened, a voltage drop when an electric current flows from the silicide layer 18 to the source/drain extended regions 11a, 13a can be relaxed. Even if the encroachment amount in a lateral direction of the silicide layer 18 becomes large, disposal of the n-type semiconductor region 16 and p-type semiconductor region 17 makes it possible to avoid the problem that the silicide layer 18 is brought into contact with the source/drain extended regions 11a, 13a.

(Embodiment 3)

Figure 27:
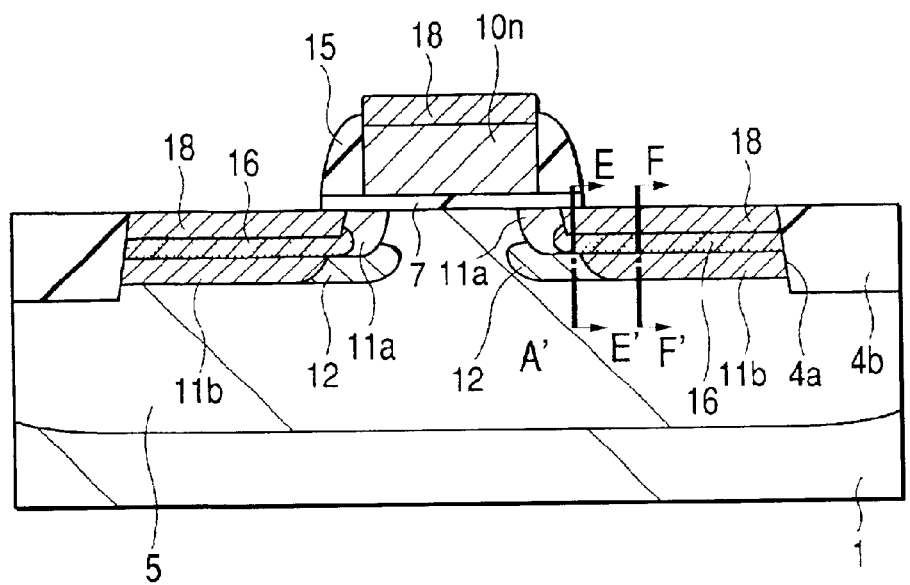
FIG. 27 is an enlarged cross-sectional view of an n channel type MISFET according to Embodiment 3 of the present invention.
Figure 28A:
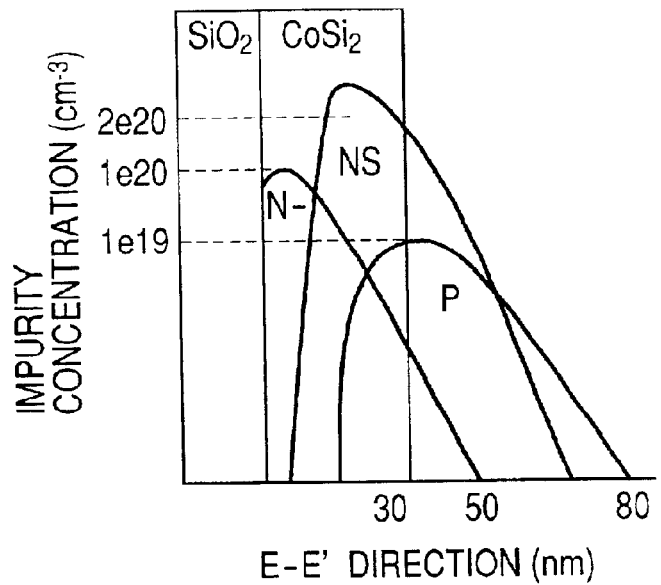
FIGS. 28(a) and 28(b) show one example of an impurity concentration profile taken along lines E–E' and F–F' of FIG. 27.
Figure 28B:
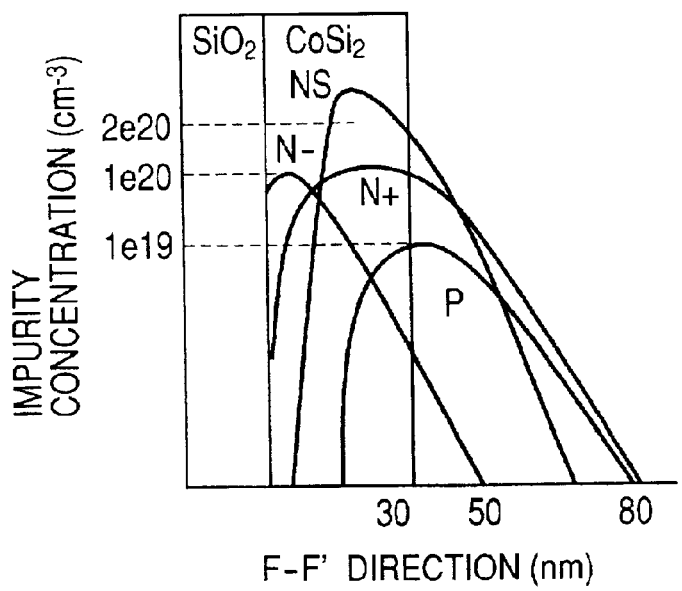
Figure 29A:
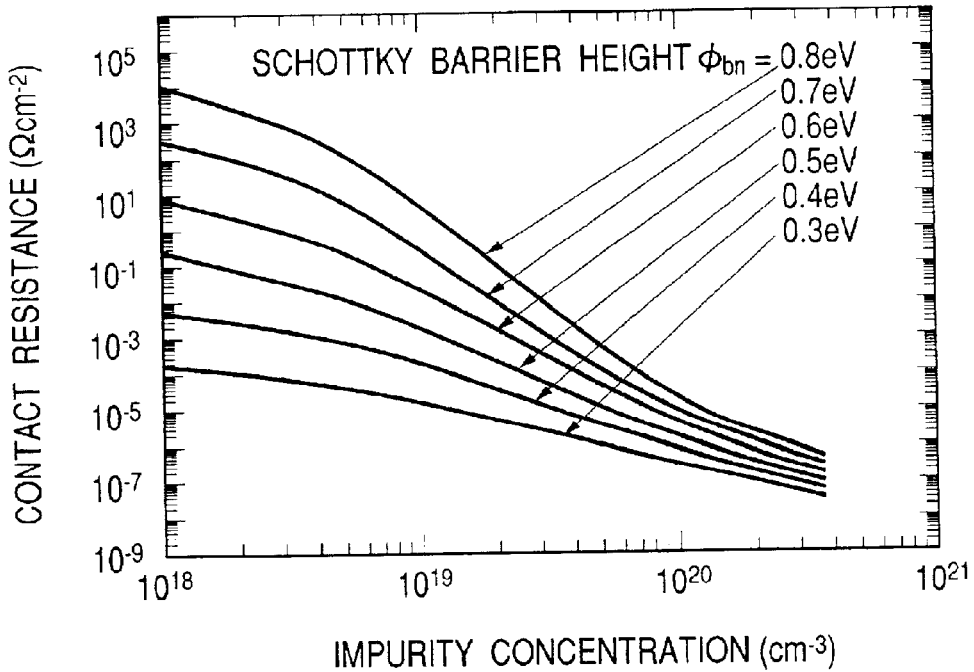
FIGS. 29(a) and 29(b) are graphs illustrating the influence of an impurity concentration in a semiconductor on the contact resistance between a metal and a semiconductor.
Figure 29B:
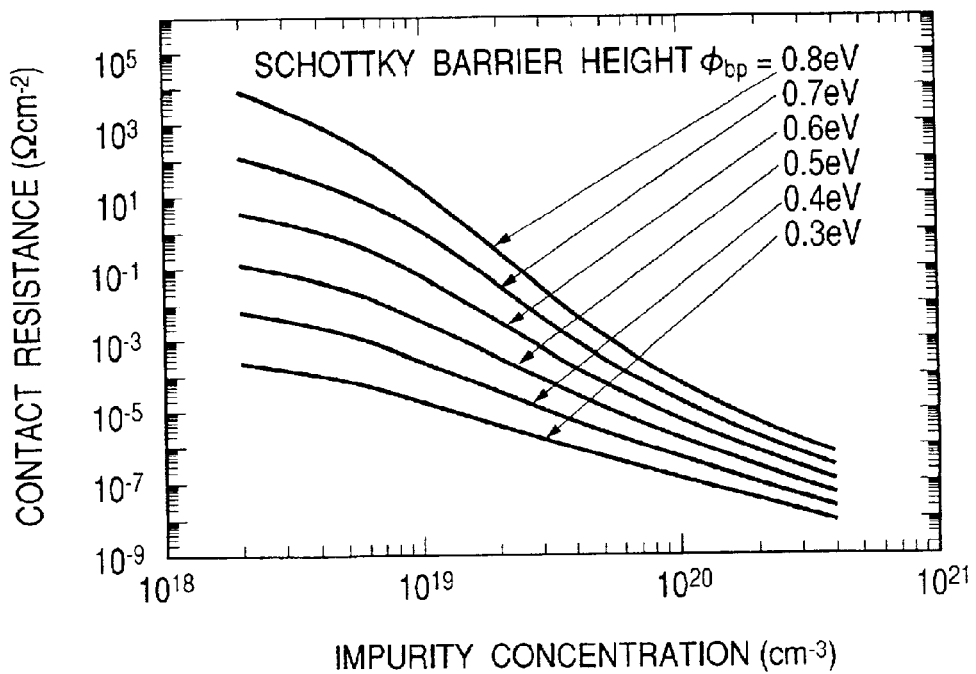

FIG. 27 is an enlarged cross-sectional view of a semiconductor substrate illustrating an n channel type MISFET according to further embodiment of the present invention, and FIG. 28 is one example of an impurity concentration profile, taken along lines E–E' and F–F' of FIG. 27, of each of the n-type impurity and p-type impurity introduced into the substrate 1.

In the substrate 1 (line E–E') in the vicinity of the end portion of the side wall spacers 15, formed are source/drain extended regions 11a having a concentration profile (N–) with a peak at about $1\times10^{20}$ cm$^{-3}$, pocket region 12 which is in contact with the lower portion of the source/drain extended regions 11a and has a concentration profile (P) with a peak at about $1\times10^{19}$ cm$^{-3}$, and n-type semiconductor region 16 having a concentration of about $1\times10^{20}$ cm$^{-3}$ at the end portion of the silicide layer 18 and having a concentration profile (NS) with a peak at $2\times10^{20}$ cm$^{-3}$ (FIG. 28(a)).

In a region of the substrate 1 (line F–F') wherein neither gate electrode 10n nor side wall spacers 15 are formed, formed are source/drain extended regions 11a having a concentration profile (N–) with a peak at about $1\times10^{20}$ cm$^{-2}$, pocket region 12 which is in contact with the lower portion of the source/drain extended regions 11 and has a concentration profile (P) with a peak at about $1\times10^{19}$ cm$^{-3}$, n-type semiconductor region 16 having a concentration of about $1\times10^{20}$ cm$^{-3}$ at the end portion of the silicide layer 18 and having a concentration profile (NS) with a peak at $2\times10^{20}$ cm$^{-3}$, and source/drain diffused regions 11$b$ which are arranged at a position deeper than the n-type semiconductor region 16 and has a concentration profile (N+) with a peak at 1×10$^{20}$ cm$^{-3}$ or greater (FIG. 28($b$)).

As illustrated in FIG. 28, the junction depth (Xj$_{N-}$) of the source/drain extended regions 11$a$ is set smaller than the junction depth (Xj$_{NS}$) of the n-type semiconductor region 16 and the junction depth (Xj$_{NX}$) of the n-type semiconductor region 16 is set smaller than the junction depth (Xj$_{N+}$) of the source/drain diffused regions 11$b$. In short, the above-described equation (2) is satisfied.

In addition, the impurity concentration (C$_{NS}$) of the semiconductor region 16 is set higher than the impurity concentration (C$_{N-}$) of the source/drain extended regions 11$a$. At the end portion of the silicide layer 18 which exists at the substrate 1 (line E–E') in the vicinity of the end portion of the side wall spacer 15, the n-type semiconductor region 16 having a concentration of about 1×10$^{20}$ cm$^{-3}$ or greater is formed and with this n-type semiconductor region 16, a portion or the whole portion of the end portion of the silicide layer 18 is surrounded. Also below the silicide layer 18 on the substrate (line F–F') on which neither gate electrode 10$n$ nor side wall spacer 15 is formed, the n-type semiconductor region 16 having a concentration of 1×10$^{20}$ cm$^{-3}$ or greater is formed.

The impurity concentration (C$_{N+}$) of the source/drain diffused regions 11$b$ is, on the other hand, set at a concentration capable of suppressing leak current from the silicide layer 18 and it is set equal or lower than the impurity concentration (C$_{NS}$) of the n-type semiconductor region 16. In short, the following equation (4) is satisfied.

$$C_{NS} \geq C_{N+} \text{Equation} \quad (4)$$

According to Embodiment 3, as described above, the lower portion of the silicide layer 18 is surrounded by the n-type semiconductor region 16 having a concentration of 1×10$^{20}$ cm$^{-3}$ or greater, making it possible to set the impurity concentration of the source/drain diffused regions 11$b$ at a relatively low level and in turn, to reduce the dose upon ion implantation, thereby accomplishing a decrease in damage and improvement in a throughput.

The present invention made by the present inventors was so far described specifically based on various embodiments. It should however be borne in mind that the present invention is not limited to or by them and can be modified within an extent not departing from the scope or spirit of the present invention.

Effects of the typical inventions, among those disclosed by the present application, will next be described simply.

According to the present invention, a semiconductor region having an impurity concentration of about 1×10$^{20}$ cm$^{-3}$ and formed between source/drain diffused regions and silicide layer is formed to decrease the contact resistance therebetween, thereby reducing a voltage drop when an electric current from the silicide layer to the source/drain diffused regions flows. This makes it possible to reduce a current drop and realize high-speed operation of MISFET.

What is claimed is:

1. A method of manufacturing a semiconductor integrated circuit device, comprising steps of:
   (a) forming a gate electrode over a substrate;
   (b) implanting ions of a first n-type impurity in the substrate at both ends of said gate electrode, thereby forming source/drain extended regions;
   (c) forming side wall spacers on the side walls of said gate electrode;
   (d) implanting ions of a second n-type impurity in said substrate in self alignment with said gate electrode and said side wall spacers, to form source/drain diffused regions comprising a higher impurity concentration than said source/drain extended regions;
   (e) cleaning said substrate; and
   (f) depositing a refractory metal film over said substrate, and forming a silicide layer on a surface of said source/drain diffused regions by heat treatment, wherein said method further comprises, after said step (c), a step of implanting ions of a third n-type impurity into said substrate in self alignment with said gate electrode and said side wall spacers, to form a semiconductor region comprising a higher impurity concentration than said source/drain extended regions, and
   wherein said source/drain extended regions, said semiconductor region, said silicide layer, and said source/drain diffused regions are arranged in the order of mention from a channel region toward the end portion of said side wall spacers in the substrate.

2. A method of manufacturing a semiconductor integrated circuit device according to claim 1, wherein prior to said step of forming said semiconductor region, said substrate is cleaned.

3. A method of manufacturing a semiconductor integrated circuit device according to claim 1, wherein subsequent to said heat treatment of said step (f), an unreacted portion of said refractory metal film is removed.

4. A method of manufacturing a semiconductor integrated circuit device according to claim 1, wherein said silicide film is formed over each of a surface of the silicon film constituting said gate electrode and a surface of said source/drain diffused regions.

5. A method of manufacturing a semiconductor integrated circuit device according to claim 1, wherein said side wall spacers are each comprised of a silicon oxide film.

6. A method of manufacturing a semiconductor integrated circuit device according to claim 1, wherein ions of said third n-type impurity are introduced in said substrate by oblique implantation at a predetermined inclination relative to a normal line of said substrate.

7. A method of manufacturing a semiconductor integrated circuit device according to claim 1, wherein ions of said second n-type impurity are introduced by vertical implantation to said substrate from said normal line direction of said substrate, while ions of said third n-type impurity are introduced by oblique implantation at a predetermined angle relative to said normal line direction of said substrate.

8. A method of manufacturing a semiconductor integrated circuit device according to claim 1, wherein an impurity concentration of said source/drain diffused regions is equal to or higher than that of said semiconductor region.

9. A method of manufacturing a semiconductor integrated circuit device according to claim 1, wherein an impurity concentration of said source/drain diffused regions is equal to or lower than that of said semiconductor region.

10. A method of manufacturing a semiconductor integrated circuit device according to claim 1, wherein a junction depth of said semiconductor region is greater than that of said source/drain extended regions but smaller than that of said source/drain diffused regions.

11. A method of manufacturing a semiconductor integrated circuit device according to claim 1, wherein said step (b) further comprises implanting ions of a p-type impurity in said substrate in self alignment with said gate electrode, thereby forming a pocket region in contact with the lower portion of said source/drain extended regions.

12. A method of manufacturing a semiconductor integrated circuit device according to claim 1, wherein a gate length of said gate electrode is 0.15 pm or less or a spacer length of said side wall spacers is 0.07 pm or less.

13. A method of manufacturing a semiconductor integrated circuit device according to claim 1, further comprising, prior to said step (d), a step of forming a selective epitaxial layer on the exposed surface of said substrate.

14. A method of manufacturing a semiconductor integrated circuit device, comprising steps of:
  (a) forming a gate electrode over a substrate;
  (b) introducing an impurity in said substrate in self alignment with said gate electrode for forming source/drain extended regions;
  (c) forming side wall spacers on side surfaces of said gate electrode;
  (d) introducing an impurity in said substrate in self alignment with said side wall spacers for forming source/drain diffused regions;
  (e) introducing an impurity into said substrate in self alignment with said gate electrode and said side wall spacers by oblique implantation at a predetermined inclination relative to a normal line of said substrate for forming semiconductor regions having the same conductivity type of said source/drain diffused regions and source/drain extended regions;
  (f) after said steps (d) and (a), cleaning said substrate and depositing a refractory metal film over said substrate for forming silicide layers on a surface of said source/drain diffused regions by heat treatment,
  wherein said source/drain extended regions, said semiconductor regions and said source/drain diffused regions are arranged in the order of mention from a channel region to the end portion of said side wall spacers in the substrate,
  wherein a junction depth of each of said semiconductor regions is greater than that of said source/drain extended regions but smaller than that of said source/drain diffused regions, and
  wherein an impurity concentration of said source/drain extended regions is lower than that of said semiconductor regions and said source/drain diffused regions.

15. A method of manufacturing a semiconductor integrated circuit device according to claim 14, wherein an impurity concentration of said source/drain diffused regions is equal to or higher than that of said semiconductor region.

16. A method of manufacturing a semiconductor integrated circuit device according to claim 14, further comprising the step of:
  before said steps (d) and (a), forming a selective epitaxial layer on regions of said substrate not covered by said side walls.

17. A method of manufacturing a semiconductor integrated circuit device according to claim 14, wherein an impurity concentration of said source/drain diffused regions is equal to or lower than that of said semiconductor regions.

18. A method of manufacturing a semiconductor integrated circuit device according to claim 14, wherein said side wall spacers are each comprised of a silicon oxide film.

19. A method of manufacturing a semiconductor integrated circuit device according to claim 14, wherein said step (b) further comprises implanting ions of a p-type impurity in said substrate in self alignment with said gate electrode, thereby forming a pocket region in contact with the lower portion of said source/drain extended regions.

20. A method of manufacturing a semiconductor integrated circuit device according to claim 14, wherein in step (f), the refractory metal is cobalt and the silicide layer formed is a cobalt silicide layer.

21. A method of manufacturing a semiconductor integrated circuit device, comprising steps of:
  (a) introducing an impurity in a substrate in self alignment with a gate electrode for forming source/drain extended regions;
  (b) forming side wall spacers on side surfaces of said gate electrode;
  (c) introducing an impurity in said substrate in self alignment with said side wall spacers for forming source/drain diffused regions;
  (d) introducing an impurity into said substrate in self alignment with said gate electrode and said side wall spacers for forming a semiconductor regions having the same conductivity type of said source/drain diffused regions and source/drain extended regions; and
  (e) after said steps (c) and (d), cleaning said substrate and depositing a refractory metal film over said substrate for forming silicide layers on a surface of said source/drain diffused regions by heat treatment,
  wherein before said steps (c) and (d), a selective epitaxial layer is formed on regions of said substrate not covered by said side wall spacers,
  wherein said source/drain extended regions, said semiconductor regions and said source/drain diffused regions are arranged in the order of mention from a channel region to the end portion of said side wall spacers in the substrate,
  wherein a junction depth of each of said semiconductor regions is greater than that of said source/drain extended regions and smaller than that of said source/drain diffused regions, and
  wherein an impurity concentration of said source/drain extended regions is lower than that of said semiconductor regions and said source/drain diffused regions.

22. A method of manufacturing a semiconductor integrated circuit device according to claim 21, wherein said refractory metal film and said silicide layer are a cobalt film and a cobalt silicide layer, respectively.

23. A method of manufacturing a semiconductor integrated circuit device according to claim 21, wherein an impurity concentration of said source/drain diffused regions is equal to or lower than that of said semiconductor regions.

24. A method of manufacturing a semiconductor integrated circuit device according to claim 21, wherein said side wall spacers are each comprised of a silicon oxide film.

25. A method of manufacturing a semiconductor integrated circuit device according to claim 21, wherein at said step (d), said impurity is introduced in said substrate by oblique implantation at a predetermined inclination relative to a normal line of said substrate.

26. A method of manufacturing a semiconductor integrated circuit device according to claim 21, wherein said step (a) further comprises implanting ions of a p-type impurity in said substrate in self alignment with said gate electrode, thereby forming a pocket region in contact with the lower portion of said source/drain extended regions.

27. A method of manufacturing a semiconductor integrated circuit device according to claim 21, wherein in step (e), the refractory metal is cobalt and the silicide layer formed is a cobalt silicide layer.

28. A method of manufacturing a semiconductor integrated circuit device, comprising steps of (a) forming a gate electrode over a substrate;

(b) introducing an impurity in said substrate in self alignment with said gate electrode for forming source/drain extended regions;

(c) forming side wall spacers on side surfaces of said gate electrode;

(d) introducing an impurity into said substrate in self alignment with said side wall spacers for forming source/drain diffused regions;

(e) introducing an impurity into said substrate in self alignment with said gate electrode and said side wall spacers by oblique implantation at a predetermined inclination relative to a normal line of said substrate for forming semiconductor regions having the same conductivity type of said source/drain diffused regions and said source/drain extended regions;

(f) after said step (e), cleaning said substrate;

(g) depositing a refractory metal film over said substrate, and forming a silicide layer on at least a surface of said source/drain diffused regions by heat treatment, wherein said source/drain extended regions, at least one of said semiconductor regions and said source/drain diffused regions are arranged in the order of mention from a channel region to the end portion of said side wall spacers in the substrate, and wherein an impurity concentration of said source/drain extended regions is lower than that of said semiconductor regions and said source/drain diffused regions.

29. A method of manufacturing a semiconductor integrated circuit device according to claim 28, wherein an impurity concentration of said source/drain diffused regions is equal to or lower than that of said semiconductor regions.

30. A method of manufacturing a semiconductor integrated circuit device according to claim 28, wherein said side wall spacers are each comprised of a silicon oxide film.

31. A method of manufacturing a semiconductor integrated circuit device according to claim 28, wherein said step (b) further comprises implanting ions of a p-type impurity in said substrate in self alignment with said gate electrode, thereby forming a pocket region in contact with the lower portion of said source/drain extended regions.

32. A method of manufacturing a semiconductor integrated circuit device, comprising steps of (a) forming a gate electrode over a substrate;

(b) introducing an impurity in said substrate in self alignment with said gate electrode for forming source/drain extended regions;

(c) forming side wall spacers on side surfaces of said gate electrode;

(d) introducing an impurity into said substrate in self alignment with said side wall spacers for forming source/drain diffused regions;

(e) introducing an impurity into said substrate in self alignment with said gate electrode and said side wall for forming semiconductor regions having the same conductivity type of said source/drain diffused regions and said source/drain extended regions;

(f) after said step (e), cleaning said substrate; and (g) depositing a refractory metal film over said substrate for forming silicide layers on a surface of said source/drain diffused regions by heat treatment, wherein at said step (e), said impurity is introduced in said substrate by oblique implantation at a predetermined inclination relative to a normal line of said substrate so that the end portion of said semiconductor regions is disposed between the end portion of said source/drain diffused regions and the end portion of said source/drain extended regions, wherein said semiconductor regions surround at least a portion of one of said silicide layers on a surface of said source/drain diffused regions, and wherein an impurity concentration of said source/drain extended regions is lower than that of said semiconductor regions and said source/drain diffused regions.

33. A method of manufacturing a semiconductor integrated circuit device according to claim 32, wherein an impurity concentration of said source/drain diffused regions is equal to or lower than that of said semiconductor regions.

34. A method of manufacturing a semiconductor integrated circuit device according to claim 32, wherein a junction depth of said semiconductor regions is greater than that of said source/drain extended regions but smaller than that of said source/drain diffused regions.

35. A method of manufacturing a semiconductor integrated circuit device according to claim 32, wherein in step (g), the refractory metal is cobalt and the silicide layer formed is a cobalt silicide layer.

* * * * *